US012560761B2

(12) United States Patent
Simoyama

(10) Patent No.: US 12,560,761 B2
(45) Date of Patent: Feb. 24, 2026

(54) PHOTODETECTOR AND PHOTONIC INTEGRATED DEVICE

(71) Applicant: Fujitsu Optical Components Limited, Kawasaki (JP)

(72) Inventor: Takasi Simoyama, Zama (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 706 days.

(21) Appl. No.: 17/887,763

(22) Filed: Aug. 15, 2022

(65) Prior Publication Data

US 2023/0085007 A1     Mar. 16, 2023

(30) Foreign Application Priority Data

Sep. 16, 2021    (JP) ................................. 2021-151528

(51) Int. Cl.
*H10F 30/223*          (2025.01)
*G02B 6/122*           (2006.01)
(Continued)

(52) U.S. Cl.
CPC ......... *G02B 6/1228* (2013.01); *H10F 30/223* (2025.01); *H10F 77/122* (2025.01); *H10F 77/413* (2025.01); *H10F 39/184* (2025.01)

(58) Field of Classification Search
CPC .... H10F 30/223; G02B 6/125; G02B 6/12004
See application file for complete search history.

(56) References Cited

U.S. PATENT DOCUMENTS

| 7,397,101 B1 | 7/2008 | Masini et al. |
| 9,035,409 B2 | 5/2015 | Na |

(Continued)

FOREIGN PATENT DOCUMENTS

| CN | 103137777 A | 6/2013 | |
| EP | 2736084 A1 * | 5/2014 | ..... H01L 31/022408 |

(Continued)

OTHER PUBLICATIONS

Elisa De Ranieri, Infrared silicon, Feb. 5, 2014, Nature Nanotechnology (Year: 2014).*

(Continued)

*Primary Examiner* — Calvin Y Choi
(74) *Attorney, Agent, or Firm* — STAAS & HALSEY LLP

(57) ABSTRACT

A photodetector has a substrate, a light input layer formed as a first semiconductor over the substrate, the first semiconductor being transparent to a wavelength being used, and a light absorption layer formed as a second semiconductor on the light input layer, the second semiconductor having a bandgap smaller than that of the first semiconductor. The light absorption layer has a first region doped with a first conductivity-type impurity, a second region doped with a second conductive-type impurity different from the first conductive-type impurity, and an undoped region between the first region and the second region. The first region, the undoped region and the second region are arranged in a direction parallel to the substrate. The light absorption layer has a region having an effective refractive index higher than the rest of the light absorption layer between the first region and the second region.

10 Claims, 17 Drawing Sheets

40

(51) Int. Cl.

| | | |
|---|---|---|
| *H10F 39/18* | (2025.01) |
| *H10F 77/122* | (2025.01) |
| *H10F 77/40* | (2025.01) |

(56) References Cited

U.S. PATENT DOCUMENTS

2007/0104441 A1* 5/2007 Ahn .................... G02B 6/12004
385/27
2013/0126941 A1 5/2013 Zhu et al.

FOREIGN PATENT DOCUMENTS

JP 2009-252921 10/2009
JP 2015220290 A * 12/2015

OTHER PUBLICATIONS

Peter J. Collings, Simple measurement of the band gap in silicon and germanium, Mar. 1980, Am. J. Phys., vol. 48, No. 3, pp. 197-199 (Year: 1980).*
Kuan-Chih Lin et al. "Germanium-Tin Lateral p-i-n Waveguide Photodetectors for Mid-Infrared Silicon Photonics", UTC from IEEE Xplore, Dec. 27, 2024.
Stefan Lischke et al., "High bandwidth, high responsivity waveguide-coupled germanium p-i-n photodiode", Optics Express, vol. 23, No. 21, Oct. 19, 2015.
Japanese Office Action issued in counterpart Japanese Application No. 2021-151528 dated Jan. 14, 2025.
Chinese Office Action issued in counterpart Chinese Application No. 202211100026.4 Dated Dec. 12, 2025.

* cited by examiner accumulation of holes

RELATED ART

WITH INCIDENT LIGHT OF
LOWER INTENSITY

Frequency (GHz)

WITH INCIDENT LIGHT OF
HIGHER INTENSITY

Frequency (GHz)

RELATED ART

B1

B2

RELATED ART

B3

B4

RELATED ART

(b) X–X' cross-sectional view (a) top view

INCIDENCE OF LIGHT (a) top view (b) X–X' cross-sectional view (b) X–X' cross-sectional view (a) top view (a) top view (b) X–X' cross-sectional view

FIG.7D (a) top view (b) X–X' cross-sectional view (b) X-X' cross-sectional view (a) top view

PHOTODETECTOR AND PHOTONIC INTEGRATED DEVICE

CROSS-REFERENCE TO RELATED APPLICATIONS

This application is based upon and claims priority to earlier Japanese Patent Application No. 2021-151528 filed Sep. 16, 2021, which is incorporated herein by reference in its entirety.

FIELD

The present documents relate to a photodetector and a photonic integrated device.

BACKGROUND

Research and development in the field of technology called silicon photonics have been attracting attention to deal with the increasing data traffic. By fabricating a photonic circuit on a silicon (Si) or a silicon-on-insulator (SOI) substrate, integration of a photonic circuit and an electronic circuit can be achieved on the same substrate. With such photonic integrated circuits, improvement of the conversion efficiency between electric signals and optical signals, and implementation of a compact and large-capacity optical transceiver with less power consumption are expected.

Of the photonic integrated circuits, waveguides involved in multiplexing/demultiplexing or modulation of light need to have an optical property of not absorbing light to avoid excessive loss. On the other hand, photodetectors that convert light into electric currents need to have an optical property of good light absorption. One combination that satisfies both requirements is a germanium (Ge) photodetector and Si waveguides. A configuration with a Ge photodetector and a Si waveguide and using near-infrared light with a wavelength of 1.2 µm to 1.6 µm is promising. The light in this wavelength range is transparent to Si, and is absorbed by Ge.

A configuration illustrated in FIG. 1 may be employed to extract photocarriers from the Ge photodetector connected to the Si waveguide. Separation of the photocarriers, that is electrons and holes, is achieved by doping p-type impurities in the Si waveguide (Si-WG) connected to the Ge photodetector (Ge-PD) and by doping n-type impurities in the upper part of the Ge-PD. Upon application of a reverse bias to the p-type region so that the n-type region has a higher potential, electrons are extracted from the negative electrode, and holes are extracted from the positive electrode, among the photocarriers produced by light absorption in Ge. This configuration is called a heterojunction vertical PIN structure because it has a heterointerface between Si and Ge, and because a PIN structure is formed in the direction perpendicular to the substrate.

A striped Ge photodetector formed on the Si island of a silicon-on-insulator (SOI) substrate is known. See, for example, Patent Document 1 presented below. This Ge photodetector includes a heterojunction in which a high concentration p-type impurity region and an n-type impurity region are arranged in a direction parallel to the substrate. This configuration is called a heterojunction lateral PIN structure.

In a structure having a photocarrier moving path across a heterojunction, regardless of whether the PIN structure is perpendicular or parallel to the substrate, photocarriers pass through the heterointerface at which the energy band is discontinuous. In the configuration of FIG. 1, when the holes pass through the Si/Ge heterointerface, a portion of the holes are accumulated at the interface due to the energy barrier of the valence band. The holes accumulated at the interface will shield the externally applied voltage, and cause the electric field strength of the depletion layer to fall. As a result, the response characteristics of the photodetector deteriorate and high-speed operation is hindered.

A photodetector having a satisfactory sensitivity to incident light and capable of high-speed operation is demanded.

Related art documents described above is Patent Document 1: U.S. Pat. No. 9,035,409.

SUMMARY

In an embodiment, a photodetector has a substrate, a light input layer formed as a first semiconductor over the substrate, the first semiconductor being transparent to a wavelength being used, and a light absorption layer formed as a second semiconductor on the light input layer, the second semiconductor having a bandgap smaller than that of the first semiconductor. The light absorption layer has a first region doped with a first conductivity-type impurity, a second region doped with a second conductive-type impurity different from the first conductive-type impurity, and an undoped region between the first region and the second region, the first region, the undoped region and the second region being arranged in a direction parallel to the substrate. The light absorption layer has a region having an effective refractive index higher than the rest of the light absorption layer between the first region and the second region.

The object and advantages of the invention will be realized and attained by means of the elements and combinations particularly pointed out in the claims. It is to be understood that both the foregoing general description and the following detailed description are exemplary and explanatory and are not restrictive to the invention as claimed.

BRIEF DESCRIPTION OF DRAWINGS

FIG. 7D illustrates a fabrication process of the photodetector of FIG. 5;

FIG. 9 is a schematic cross-sectional view of a photodetector according to the third embodiment;

EMBODIMENTS

Prior to describing the particulars of photodetectors according to the embodiments, the technical problem arising in a heterojunction photodetector is explained in more detail, and then technical problems arising in a homojunction photodetector are described below to facilitate understanding of the present disclosure.

Figure 2:
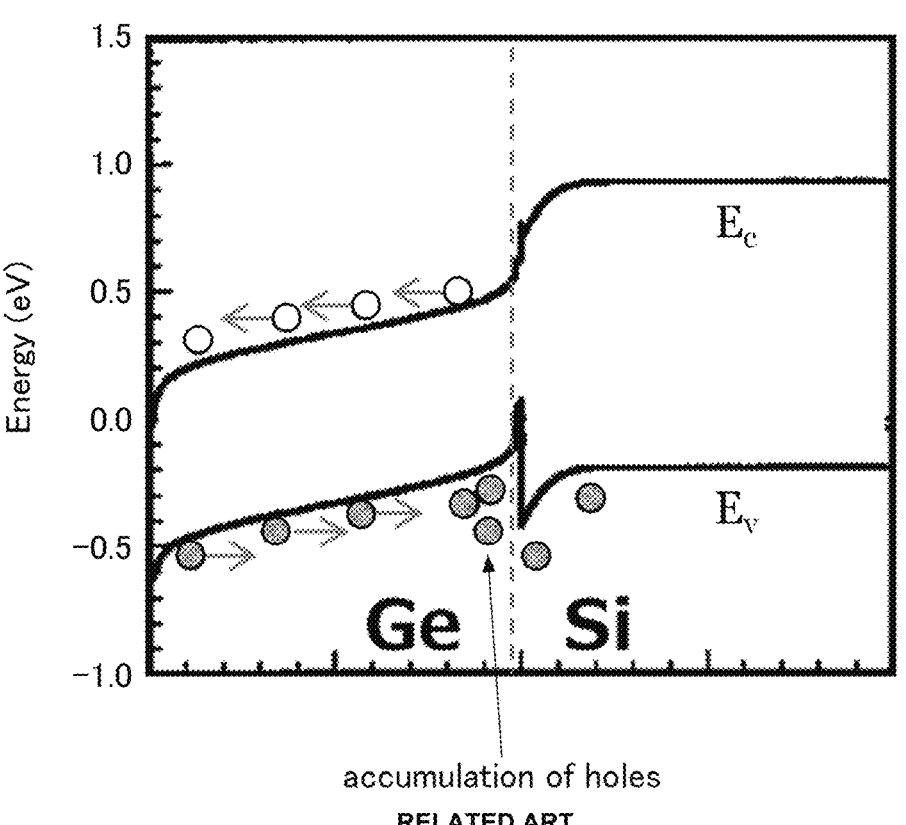
FIG. 2 illustrates energy band diagram of Si/Ge heterojunction and accumulation of holes at the heterointerface.

FIG. 2 is an energy band diagram showing the accumulation of holes at the Si/Ge heterointerface. At the interface between Si and Ge, the energy level $E_v$ of the valence band drops at the Si side and rises at the Ge side. This discontinuity of the energy band becomes a potential barrier for holes produced by light absorption in Ge.

Some of the holes get over this barrier with a certain probability by the quantum tunneling effect, but the rest of the holes are accumulated at the interface. The accumulated holes shield the externally applied voltage, and the strength of the electric field in the depletion layer decreases. The transport velocity of photocarriers in the depletion layer is almost proportional to the strength of the electric field in the steady state. The decrease in the electric field strength causes the carrier transport rate in the depletion layer to decrease. The more the accumulation of carriers, the greater the shielding effect, and the lower the carrier transport rate. Ultimately, a decrease in carrier transport rate results in the decreased conversion rate of the optical signal to an electrical signal, and the response characteristics of the photodetector deteriorates.

The higher the intensity of the incident light, the worse the response speed, because deterioration of the response speed of the photodetector depends on the density of photocarriers. In optical coherent receivers, a locally oscillated light beam is introduced into the receiver frontend circuits, simultaneously with incidence of received signal light, to perform heterodyne or homodyne detection. The intensity of the locally oscillated light tends to be increased in order to increase the responsivity, and degradation of operation speed becomes a particular problem with a strong light intensity.

Figure 1:
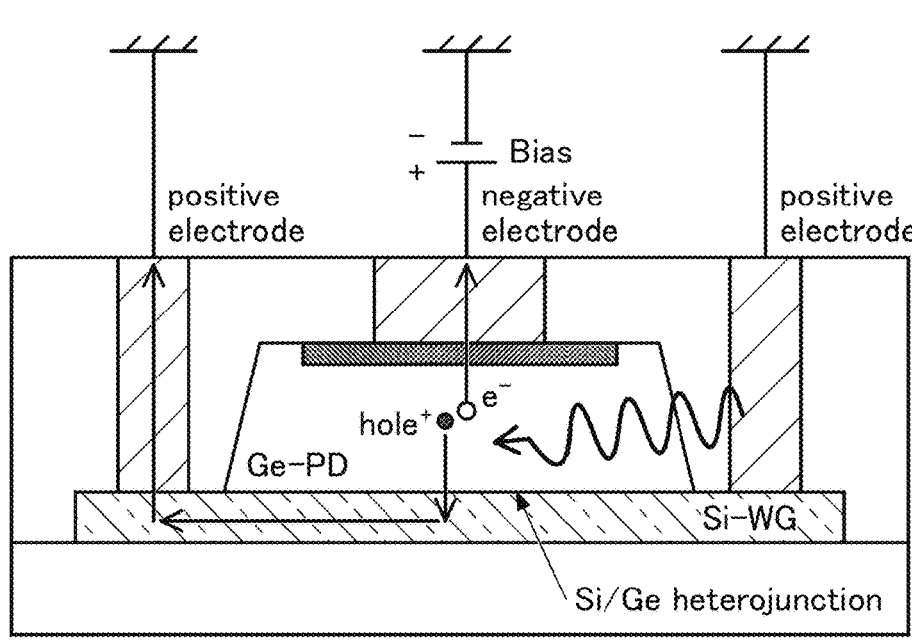
FIG. 1 is a schematic diagram of a photodetector having a heterojunction vertical PIN structure.
Figure 3A:
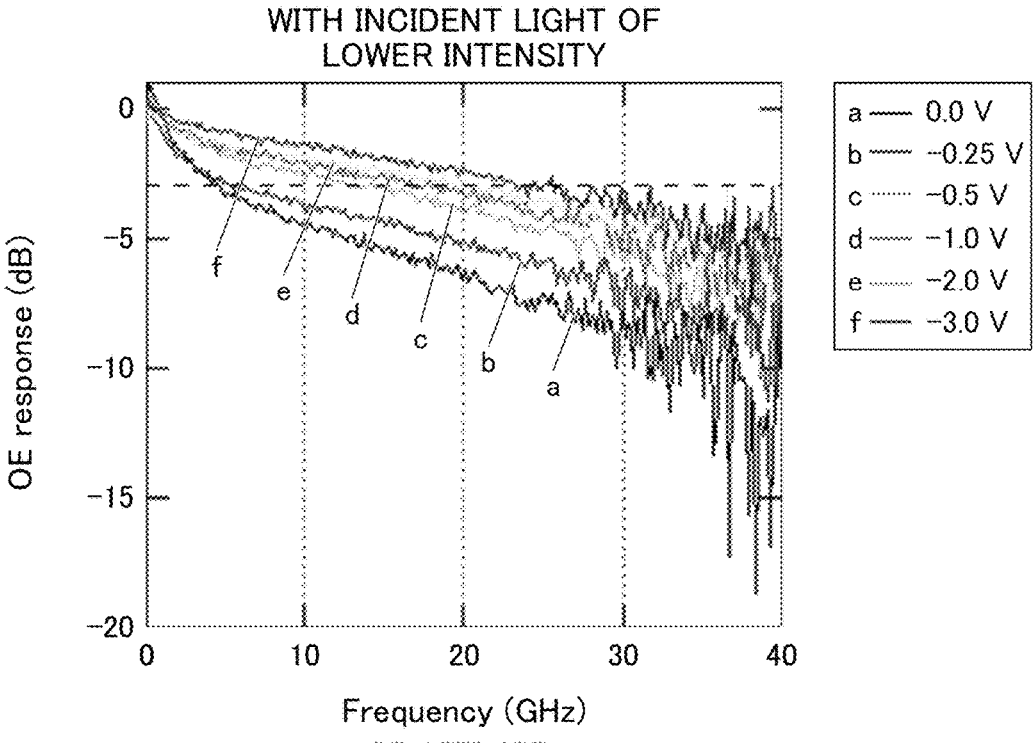
FIG. 3A illustrates an evaluation result of optical-to-electrical (O/E) response characteristics of a heterojunction photodetector actually fabricated.
Figure 3B:
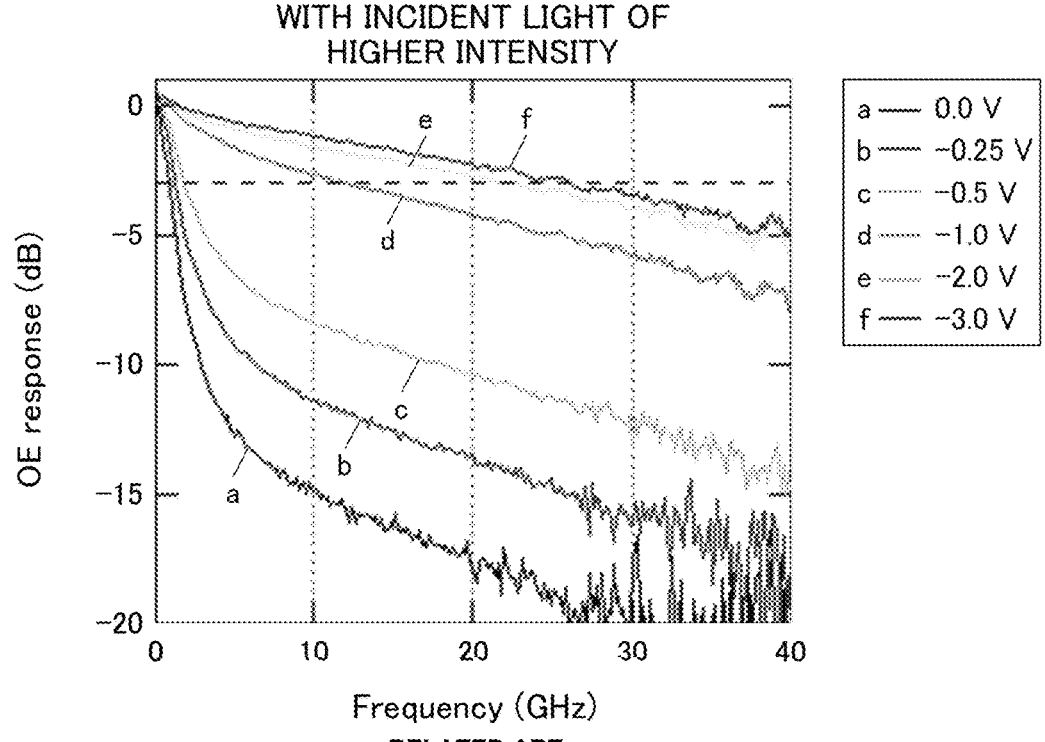
FIG. 3B illustrates an evaluation result of O/E response characteristics of a heterojunction photodetector actually fabricated.

FIG. 3A and FIG. 3B show evaluation results of the response characteristics of an actually fabricated heterojunction photodetector having the configuration of FIG. 1. The horizontal axis represents frequency (GHz) and the vertical axis represents relative response intensity (dB). The response characteristics are evaluated with a plurality of bias voltages. The 3 dB bandwidth, at which the response strength drops 3 dB from the peak response intensity at or near 0 GHz frequency, is called the response bandwidth of the photodetector. In the figures, the 3 dB attenuation line is indicated by the dashed line parallel to the horizontal axis. FIG. 3A shows the evaluation result with a lower intensity incident light, and FIG. 3B shows the evaluation result with a higher intensity incident light.

It is understood from FIG. 3A and FIG. 3B that the response bandwidth tends to narrow and the response rate tends to decrease when the incident light intensity is strong. It is also understood that the deterioration of the response characteristics is alleviated by increasing the absolute value of the bias voltage. This is because with a bias voltage of an increased magnitude, the proportion of photocarriers having energies exceeding the energy barrier at the Si/Ge interface can be increased owing to the electric field potential. By increasing the applied voltage, the accumulation of photocarriers can be reduced. However, in an actual application to an optical receiver in which the photodetector is integrated in photonic integrated circuit, the bias voltage level applicable to the photodetector is limited. In reality, it is difficult to apply a voltage just high enough to prevent response degradation.

One solution conceivable to alleviate these problems is a homojunction PIN-PD. With a homojunction PIN-PD, there is no potential barrier due to discontinuity of the energy band in the middle of the photocarrier moving path, and local accumulation of photocarriers can be avoided. The decrease in the electric field in the depletion layer can be suppressed, and band deterioration hardly occurs even with incidence of light with a strong intensity. However, there are other problems peculiar to the homojunction structure.

FIG. 4A to FIG. 4D show the problems arising in homojunction photodetectors. A Ge-PD that absorbs a light beam of a target wavelength is connected to a Si-WG that is transparent to the target wavelength being used. In the homojunction Ge-PD, high-concentration impurity regions of opposite conductivity types are provided inside the light absorption layer in the lateral or horizontal direction of the substrate. The Ge-PD has a high-concentration n-type impurity region (denoted as $n^+$ in the figure) and a high-concentration p-type impurity region (denoted as $p^+$ in the figure) with an undoped Ge layer between them. In the present specification, these high-concentration impurity regions in the light absorption layer are called electrical polarities regions, being either N-polarity region or P-polarity region depending on the conductivity type. The N-polarity region is connected to the negative electrode (denoted as "n-ELC" in the figure), and the P-polarity region is connected to the positive electrode (denoted as "p-ELC" in the figure).

When light is incident onto the electrical polarity region, a phenomenon known as free carrier absorption occurs. Accordingly, it is ideal that light is absorbed only in the undoped Ge layer. Free carrier absorption is a type of absorption that gives photon energy to existing carriers, which is different from inter-band absorption newly producing photocarriers. Because free carrier absorption does not contribute to the increase of photocurrent, free carrier absorption may be called "ineffective absorption".

Optical responsivity, which is one of the important efficiency indexes of photodetectors, is given by the ratio of the output current to the incident light intensity. It is crucial to suppress the ineffective absorption to achieve the high optical responsivity. With homojunction photodetectors, the relationship between the light intensity distribution and the electrical polarity regions is an important issue to minimize the ineffective absorption.

Figure 4A:
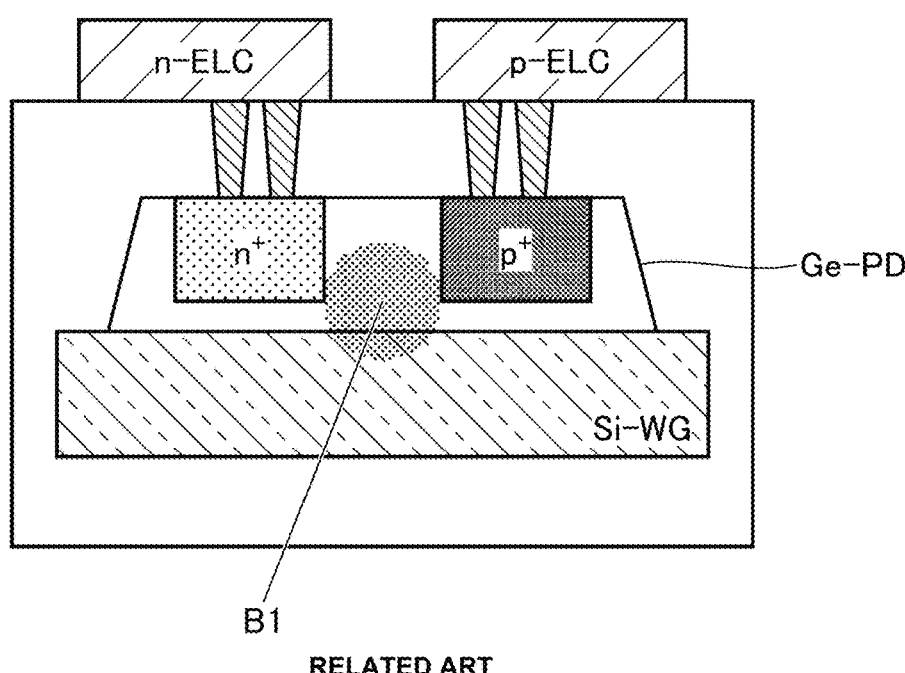
FIG. 4A is a schematic cross-sectional view to illustrates a technical problem arising in a homojunction photodetector.
Figure 4B:
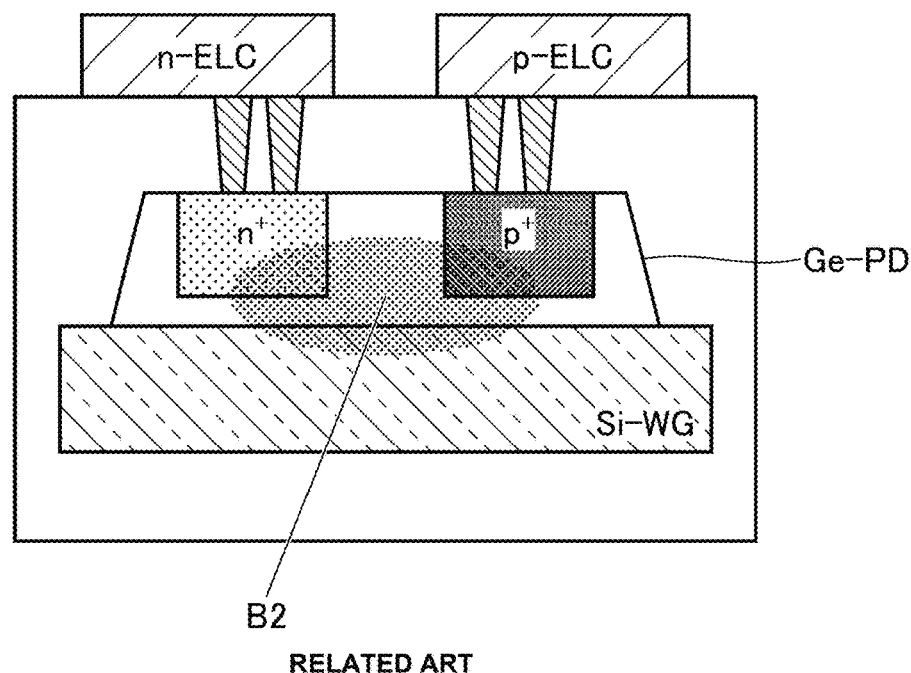
FIG. 4B is a schematic cross-sectional view to illustrates a technical problem arising in a homojunction photodetector.
Figure 4C:
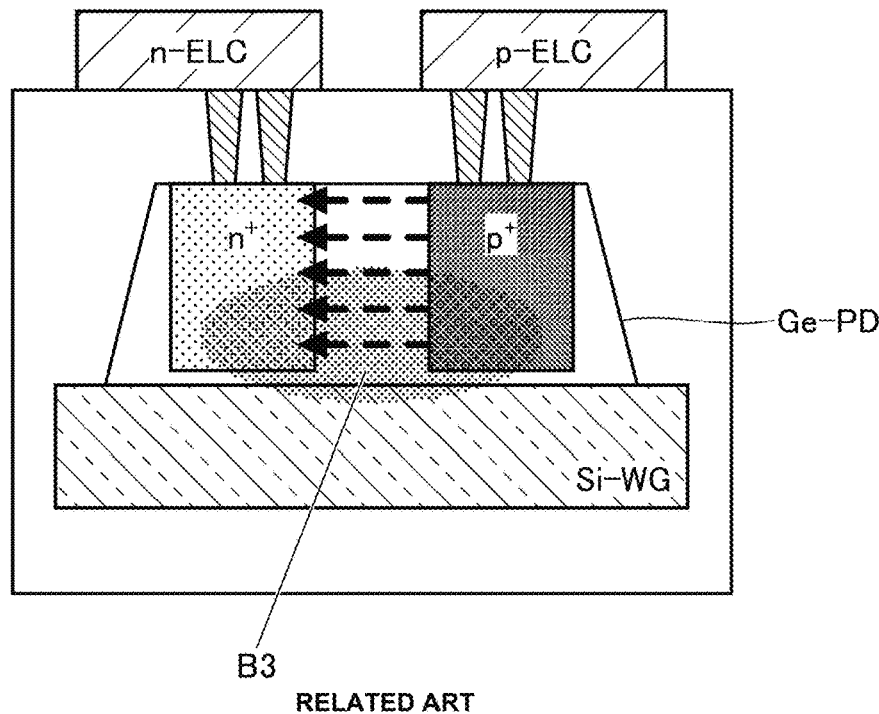
FIG. 4C is a schematic cross-sectional view to illustrates a technical problem arising in a homojunction photodetector.

Immediately after light incident onto the undoped light absorption region of the Ge-PD from the Si-WG, light B1 is distributed between the N-polarity region and P-polarity region, as illustrated in FIG. 4A. However, after propagation over a certain distance, light B2 spreads over in the entirety of the Ge layer, and enters the electrical polarity regions, as illustrated in FIG. 4B. If the electrical polarity regions are deeply formed for the purpose of increasing the electric field strength as illustrated in FIG. 4C, then the overlap between light B3 and the electrical polarity regions becomes significant, and ineffective absorption tends to occur in the electrical polarity regions. As a result, the optical responsivity falls.

Figure 4D:
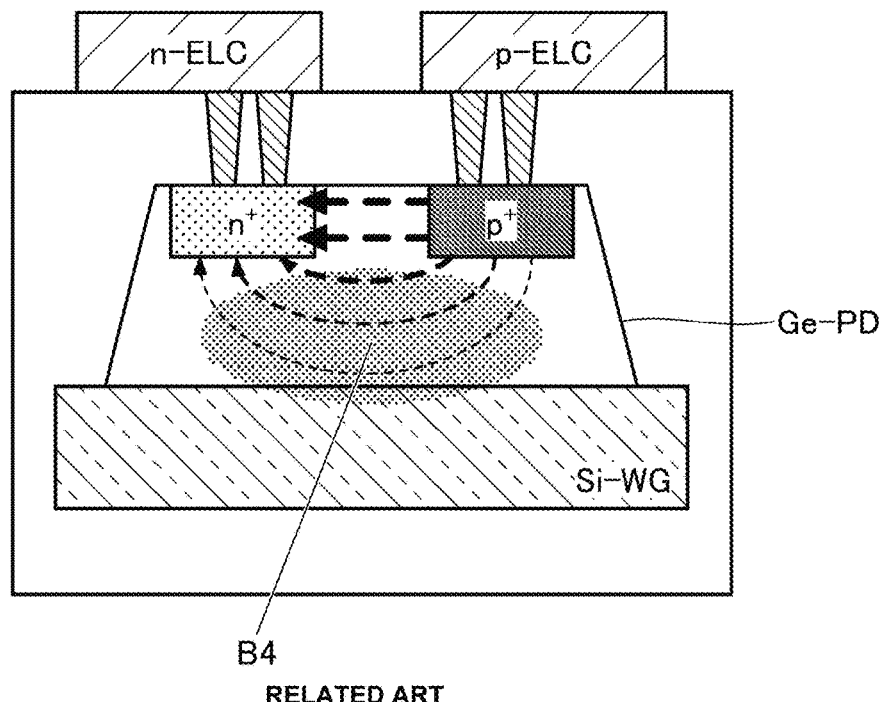
FIG. 4D is a schematic cross-sectional view to illustrates a technical problem arising in a homojunction photodetector.

To avoid the ineffective absorption occurring in FIG. 4B and FIG. 4C, it may be conceived that the electrical polarity regions are kept in the shallow region of the light absorption layer, as illustrated in FIG. 4D. The configuration of FIG. 4D may be able to suppress ineffective absorption, but the intensity distribution of light B4 is away from the electrical polarity regions. The strength of the electric field (which is schematically illustrated by the dashed arrows in the figure) generated by the potential difference between the regions with opposite electrical polarities becomes weak in the propagating region of light B4, and the response speed decreases. Due to the weakened electric field strength, the carrier transport rate will fall. For these reasons, it may be difficult for the homojunction structures illustrated in FIG. 4A to FIG. 4D to achieve both high-speed operation and satisfactory optical responsivity. In the embodiments, high-speed operation and satisfactory optical responsivity are achieved simultaneously, while employing a homojunction structure.

First Embodiment

Figure 5:
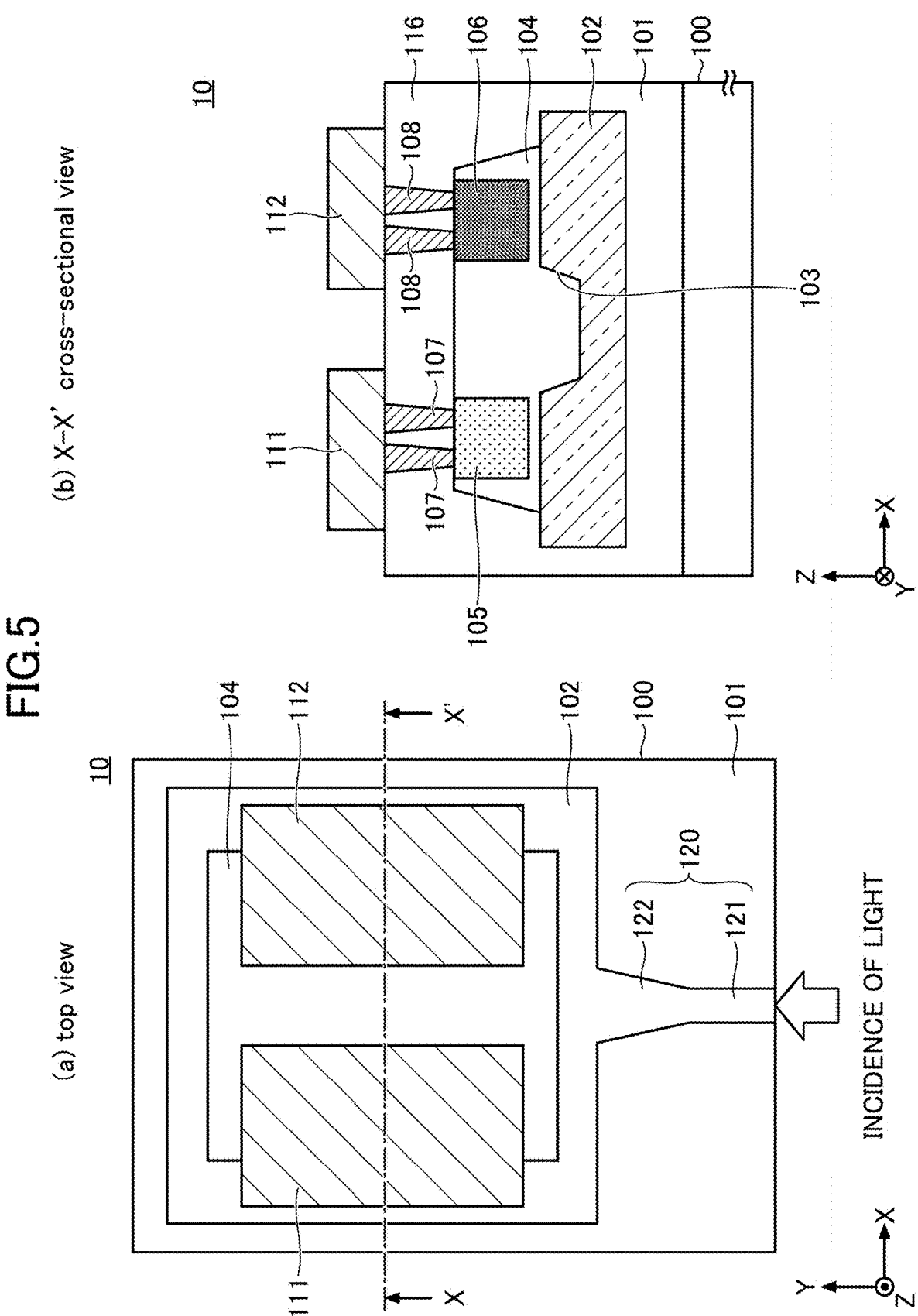
FIG. 5 illustrates in a schematic top view and a schematic cross-sectional view a photodetector according to the first embodiment.

FIG. 5 schematically illustrates in a top view (a) and a cross-sectional view (b) a photodetector 10 according to the first embodiment. The cross-sectional view (b) is taken along the X-X' line of the top view (a). In the coordinate system, the stacking direction or the film thickness direction is the Z direction, and the plane orthogonal to the Z axis is the X-Y plane. The embodiment provides a configuration of a photodetector that suppresses ineffective absorption in electrical polarity regions, while efficiently applying the electric field to the photocarrier generation region.

The photodetector 10 is formed on a dielectric layer 101 over a Si substrate 100. The photodetector 10 has a light input layer 102 and a light absorption layer 104. The light input layer 102 extends from an optical waveguide 120 to guide the propagating light to the light absorption layer 104. The entirety of the photodetector 10 and the optical waveguide 120 is surrounded by dielectric layers 101 and 116 to confine the propagating light. The dielectric layers 101 and 116 may be formed of the same material, and in this case, these dielectric layers may ultimately become a unified layer. Even in such a case, a part of the unified dielectric layer that covers the top surface of the light absorption layer 104 is referred to as a "dielectric layer 116" from the viewpoint of the layered structure with respect to the light input layer 102 and the light absorption layer 104.

It is assumed that a light beam having a wavelength of 1.2 μm to 1.6 μm (in the near infrared region) typically used in fiber-optic communication is used. The optical waveguide 120 and the light input layer 102 are formed of a first semiconductor which is transparent to the light of the above-described wavelength range, and the light absorption layer 104 is formed of a second semiconductor which absorbs the light of the above-described wavelength range. The first semiconductor is, for example, Si which has a band gap that does not absorb the light of the above wavelength range, and the second semiconductor is Ge, SiGe, GeSn, or other semiconductor compounds that have a bandgap narrower than the Si bandgap so as to absorb the light of the above wavelength range.

Ge and Sn belong to the same Group IV of the periodic table as Si, and have an advantage of being less affected by contamination during the manufacturing process, compared with III-V compound crystal materials. Of course, the material of the light absorption layer 104 is not limited to Group IV materials, and other suitable semiconductor materials whose bandgaps are appropriately tailored may be used as long as the light with a wavelength of 1.2 μm to 1.6 μm can be absorbed.

The optical waveguide 120 and the light input layer 102 formed of Si may be fabricated as a part of a photonic integrated circuit, using silicon photonics technologies. The dielectric layers 101 and 116 are formed of a material which has a large difference in refractive index with respect to both the first semiconductor and the second semiconductor. Examples of such a material include silicon dioxide (SiO2). When an SOI substrate is used, the substrate 100 may be a Si wafer, and the dielectric layer 101 may be a buried oxide (BOX) layer. In this case, the top Si layer (what is known as a SOI layer) on the BOX layer may be patterned into the optical waveguide 120 and the light input layer 102.

The optical waveguide 120 may include a constant-width optical waveguide 121, and a tapered waveguide 122 whose width continuously increases toward the light input layer 102. The light having travelled through the optical waveguide 120 is incident on the light input layer 102, and coupled to the light absorption layer 104 by evanescent coupling. Ge has a refractive index higher than Si, and accordingly, the light having travelled through Si waveguide 120 is coupled to the Ge light absorption layer by the evanescent field and is absorbed in Ge.

The light absorption layer 104 has an electrical polarity region 105 of a first conductive type, and an electrical polarity region 106 of a second conductive type inside the layer. The electrical polarity region 105 is heavily doped with, for example, n-type impurities, and the electrical polarity region 106 is heavily doped with p-type impurities. An undoped region of the light absorption layer 104 is provided between the electrical polarity regions 105 and 106 with opposite polarities. Thus, a lateral PIN structure is formed. Assuming that the light traveling direction is the Y direction, then the PIN structure is arranged in the X direction parallel to the substrate 100 and orthogonal to both the Y direction and Z direction. This PIN structure inside the Ge light absorption layer 104 is a homojunction PIN structure because there is no heterointerface on the electric current path.

In the embodiment, ineffective absorption in the electrical polarity regions 105 and 106 is minimized, and the produced photocurrents are extracted efficiently. To achieve this, a structure which effectively confines the light incident onto the light absorption layer 104 between the electrical polarity regions 105 and 106, while suppressing the light from spreading into the electrical polarity regions 105 and 106, is proposed. Specifically, the thickness of at least one of the light input layer 102, the light absorption layer 104, and the dielectric layer 116 is partially changed in the region between the electrical polarity regions 105 and 106.

In the first embodiment, a recess 103 is formed in the light input layer 102 so that the thickness of the light absorption layer 104 is partially increased. Assuming that the top surface of the light absorption layer 104 is flat, the thickness of the light absorption layer 104 increases in the region corresponding to the recess 103, by the amount of the depth of the recess 103 at which the thickness of the light input layer 102 decreases. The light is confined within the partially thickened region of the light absorption layer 104 between the electrical polarity regions 105 and 106, and ineffective absorption in the polar regions 105 and 106 is suppressed. The light confined between the electrical polarity regions 105 and 106 undergoes the sufficiently strong electric field, and photocarriers produced by light absorption are efficiently extracted. This configuration achieves satisfactory optical responsivity, and simultaneously high response speed.

Figure 6A:
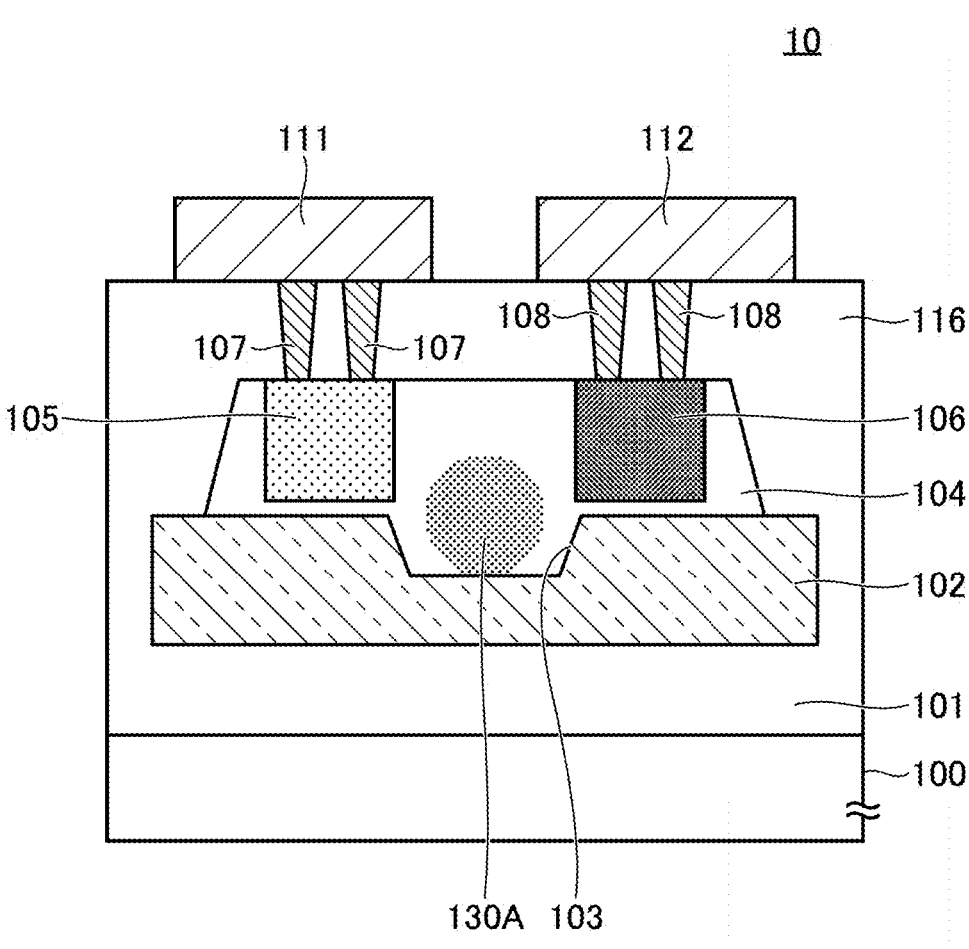
FIG. 6A is a schematic cross-sectional view to illustrates an advantageous effect of the configuration of FIG. 5.
Figure 6B:
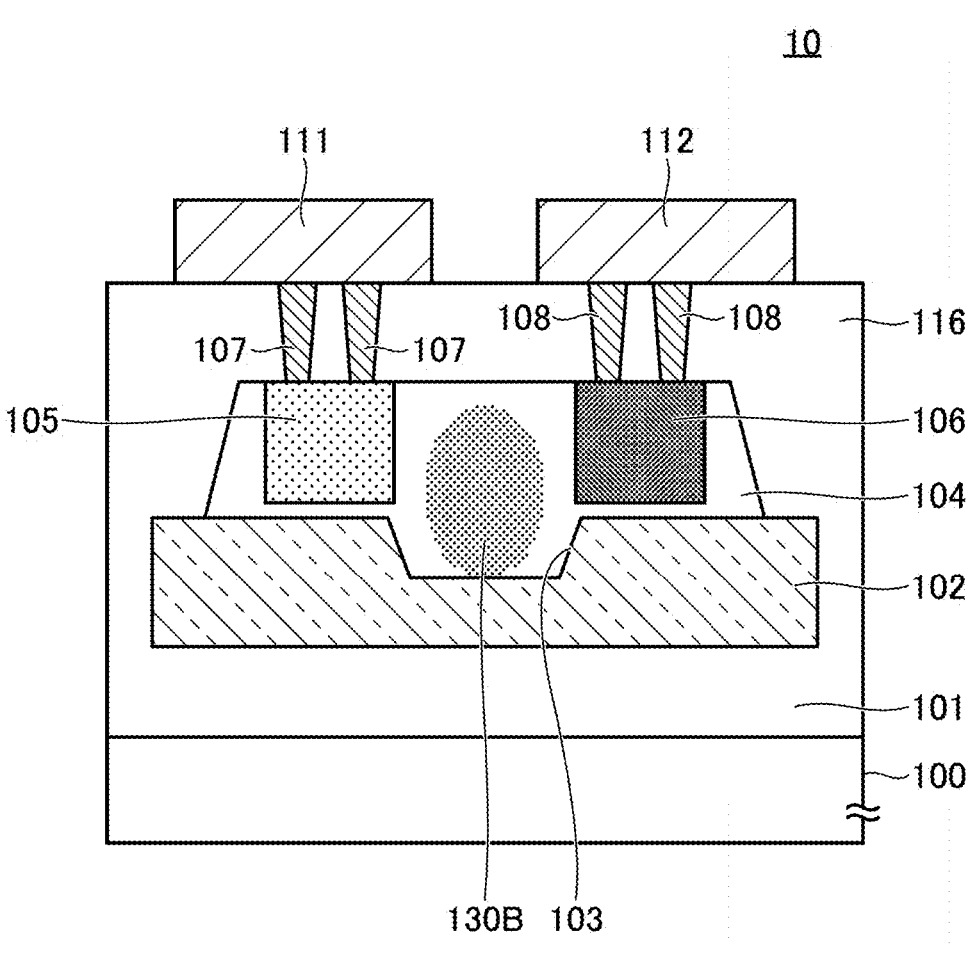
FIG. 6B is a schematic cross-sectional view illustrating an advantageous effect of the configuration of FIG. 5.

FIG. 6A and FIG. 6B illustrate advantageous effect of the configuration of FIG. 5. When the structure of FIG. 5 with the light absorption layer 104 whose thickness is partially increased in the recess 103 is turned upside down, then the light absorption layer 104 becomes what is known as a rib waveguide, and light is confined in the protruding portion with a greater thickness.

In FIG. 6A, immediately after the light coupling from the light input layer 102 to the light absorption layer 104, the light 130A stays in the internal space of the thickened region of the light absorption layer 104 adjacent to the recess 103. Now, the effective refractive indexes of the three layers, the light input layer 102, the light absorption layer 104, and the dielectric layer 116 are considered. The effective refractive index is proportional to the volume ratio occupied by the medium (i.e., space occupancy of the medium).

The refractive index of the light absorption layer 104 of Ge is greater than the refractive index of the light input layer 102 of Si, and greater than the refractive index of the dielectric layer 116 of SiO2. Accordingly, the light 130A is confined in the light absorption layer 104 in the direction normal to the substrate 100. In the horizontal direction, the effective refractive index of the thickened region of the light absorption layer 104 is greater than the effective refractive index of the regions at both sides of the recess 103 with less thickness. Accordingly, the light 130A is confined in the thickened region between the thinner regions in the lateral direction. The light 130A hardly spreads into the electrical polarity regions 105 and 106 which have a lower effective refractive index.

To efficiently confine the light 130A, it is desirable that the change in the effective refractive index due to the change in the film thickness is sufficiently large. For example, it is desirable to change the film thickness at a ratio of $1/10$ or more of the wavelength of the light 130A. If the wavelength of the light 130A is 1500 nm, it is desirable that the change in the thickness of the light absorption layer 104 increasing at the recess 103 is 150 nm or greater. With a change in the film thickness less than $1/10$ of the wavelength of the light 130A, the difference in the effective refractive index may be insufficient, and satisfactory light confinement may not be achieved in the lateral direction.

The above-described configuration can prevent the light from spreading over the entire light absorption layer 104 even after the light 130B has propagated to a certain distance in the light absorption layer 104, as illustrated in FIG. 6B. The light 130B has an intensity distribution dominant in the central region of the light absorption layer 104, namely, the region between the electrical polarity regions 105 and 106 in a plane perpendicular to the light travelling direction. Distribution of light 130B can be separated from the electrical polarity regions 105 and 106. Therefore, ineffective absorption due to free carrier absorption can be suppressed, and high optical responsivity is maintained.

Returning to FIG. 5, an electric field is applied to the light absorption layer 104 from the electrodes 111 and 112 to extract the photocarriers generated in the light absorption layer 104, as a photocurrent. The electrode 111 is electrically connected to the n-type electrical polarity region 105 via a plug electrode 107 formed in the dielectric layer 116. The electrode 112 is connected to the p-type electrical polarity region 106 via a plug electrode 108 formed in the dielectric layer 116.

By applying a positive bias voltage to the electrode 111, and applying a negative bias voltage to the electrode 112, a potential difference is produced between the electrical polarity regions 105 and 106, and the electrical polarity region 105 is in the reverse biased state. The electrons generated in the light absorption layer 104 are pulled from the electrode 111, and the holes are pulled from the electrode 112. Owing to the minimized ineffective absorption in the electrical polarity regions 105 and 106, the photocurrent corresponding to the quantity of incident light is extracted from the electrodes 111 and 112, and high optical responsivity is achieved. In addition, an electric field with a sufficient strength is applied to the photocarriers, and the response speed is kept high.

The electrical polarity regions 105 and 106 can be provided deep in the light absorption layer 104, because light 130A and 130B (which may be collectively referred to as "light 130") are separated from the electrical polarity regions 105 and 106. With the deeply provided electrical polarity regions, the electric field is applied effectively to the central region in which the light distribution is dominant. The carrier transport speed can be improved, and simultaneously, the optical responsivity can be kept high.

From the viewpoint of applying an adequate electric field to the light absorption layer 104, it is desirable that the electrical polarity regions 105 and 106 extend in the depth direction and reach ½ or more of the average thickness of the light absorption layer 104 from the top surface of the light absorption layer 104. By confining the light 130 in the region subjected to a strong electric field, the photocarriers produced region and the electric field applied region agree with each other. Carrier transport time is shortened and high-speed operation is achieved.

From the viewpoint of separating the distribution of light 130 from the electrical polarity regions 105 and 106, it is preferable that the width in the X direction of the thickened region of the light absorption layer 104, or the width in the X direction of the recess 103 is narrower than the width of the undoped region between the electrical polarity regions 105 and 106. The width direction is orthogonal to both the light travelling (Y) direction and the thickness (Z) direction. By controlling the film thickness with an appropriate width, and by regulating the effective refractive index distribution, spreading of light 130 is suppressed, and deterioration of the optical responsivity due to free carrier absorption in the electrical polarity regions 105 and 106 can be suppressed.

<Photodetector Fabrication Process>

FIG. 7A to FIG. 7F illustrate a photodiode fabrication process according to an embodiment. Each of FIG. 7A to FIG. 7F shows both a top view (a) and a cross-sectional view (b) taken along the X-X' line of the top view (a). In the following description, the materials, dimensions, forming techniques, etc. of the respective components are just examples, and the present disclosure is not limited to these examples.

Figure 7A:
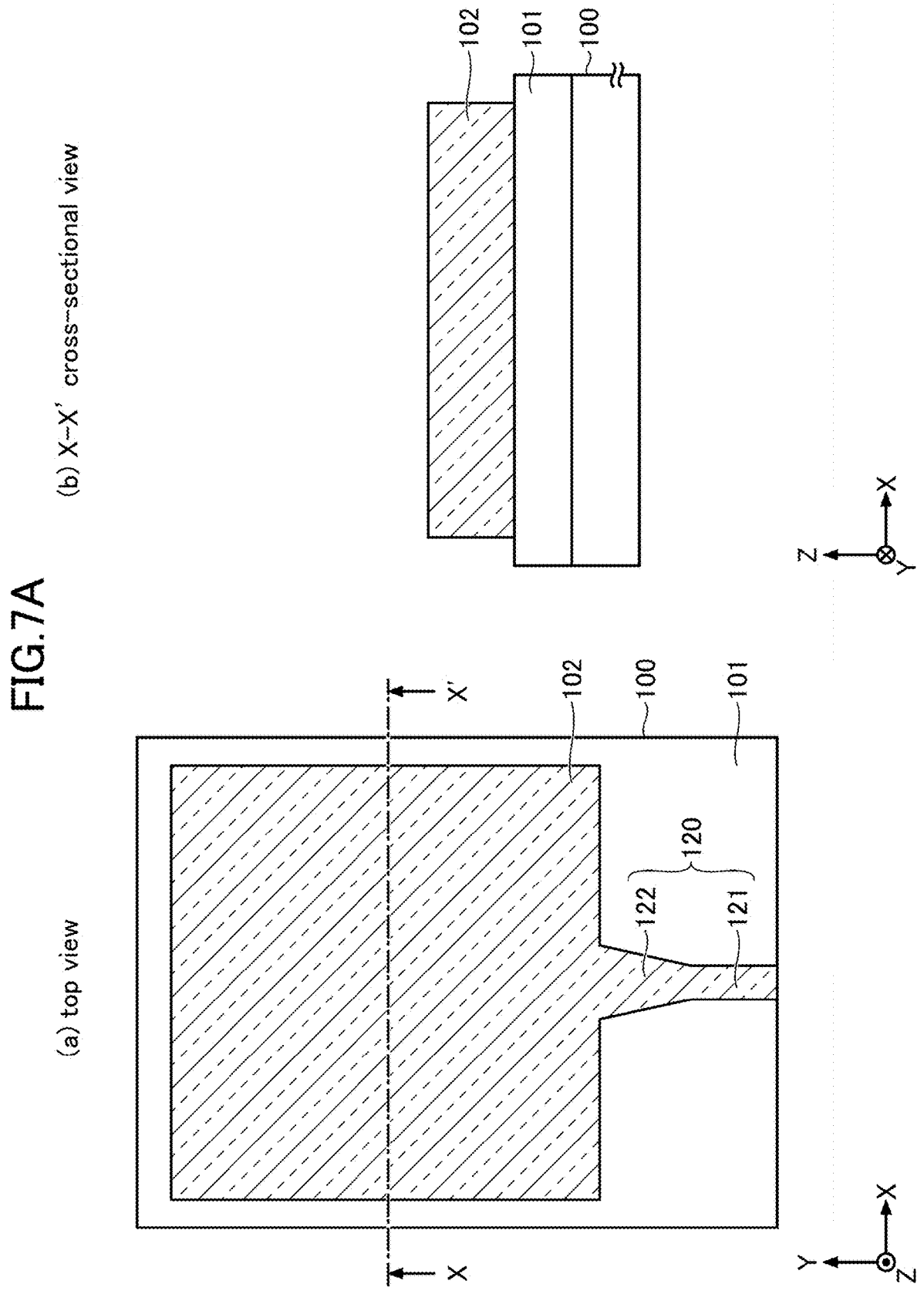
FIG. 7A illustrates a fabrication process of the photodetector of FIG. 5.

In FIG. 7A, the light input layer 102 and the optical waveguide 120 connected to the light input layer 102 are formed of Si on the dielectric layer 101 provided on the substrate 100. If an SOI substrate is used, the thickness of the Si wafer used as the substrate 100 is 750 μm, the thickness of the SiO2 layer used as the dielectric layer 101 is 2 μm, and the thickness of the Si layer (what is known as the SOI layer) formed on the SiO2 layer is 250 nm. The optical waveguide 120 and the light input layer 102 are shaped by patterning the SOI layer by, for example, electron beam (EB) lithography and inductively coupled plasma (ICP) etching.

The optical waveguide 120 may include an optical waveguide 121 and a tapered waveguide 122. The optical waveguide 121 may be connected to another optical component (such as 90° hybrid optical mixer or a wavelength filter) of the photonic integrated circuit. The tapered waveguide 122 continuously widens from the optical waveguide 121 toward the light input layer 102. The width of the optical waveguide 121 is, for example, 500 nm. The tapered waveguide 122 may be widened up to 1 μm. The dimension of the light input layer 102 in the light propagation direction (Y direction) is, for example, 35 μm, and the dimension in the width direction (X direction) is, for example, 10 μm.

Figure 7B:
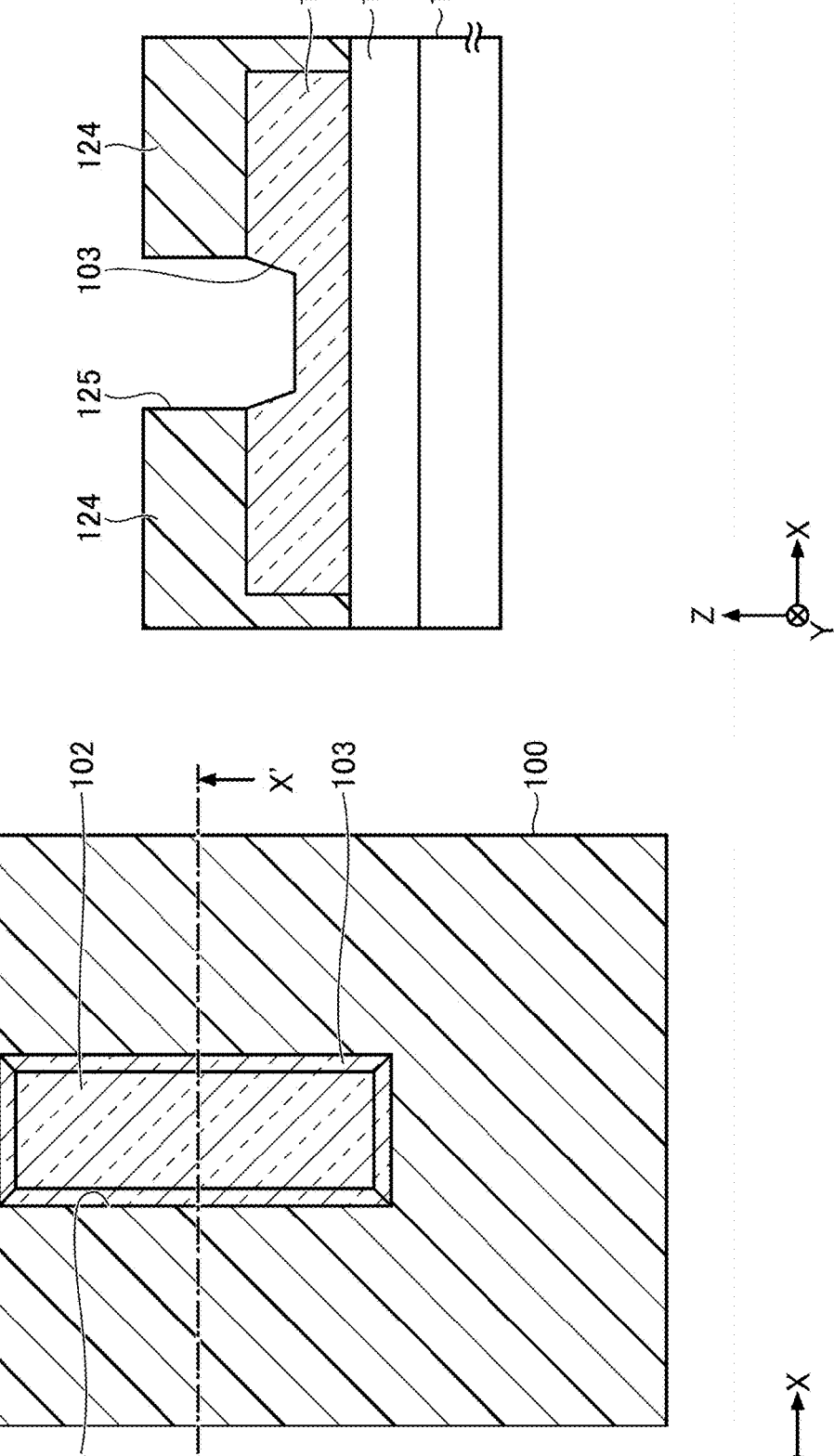
FIG. 7B illustrates a fabrication process of the photodetector of FIG. 5.

In FIG. 7B, a resist mask 124 with an opening 125 is formed by photolithography so as to expose only a part of the light input layer 102. The width of the opening 125 of the resist mask 124 is 1 μm. A portion of the Si of the light input layer 102 is removed from the opening 125 to a depth of 100 nm by dry etching, and a recess 103 is formed.

Figure 7C:
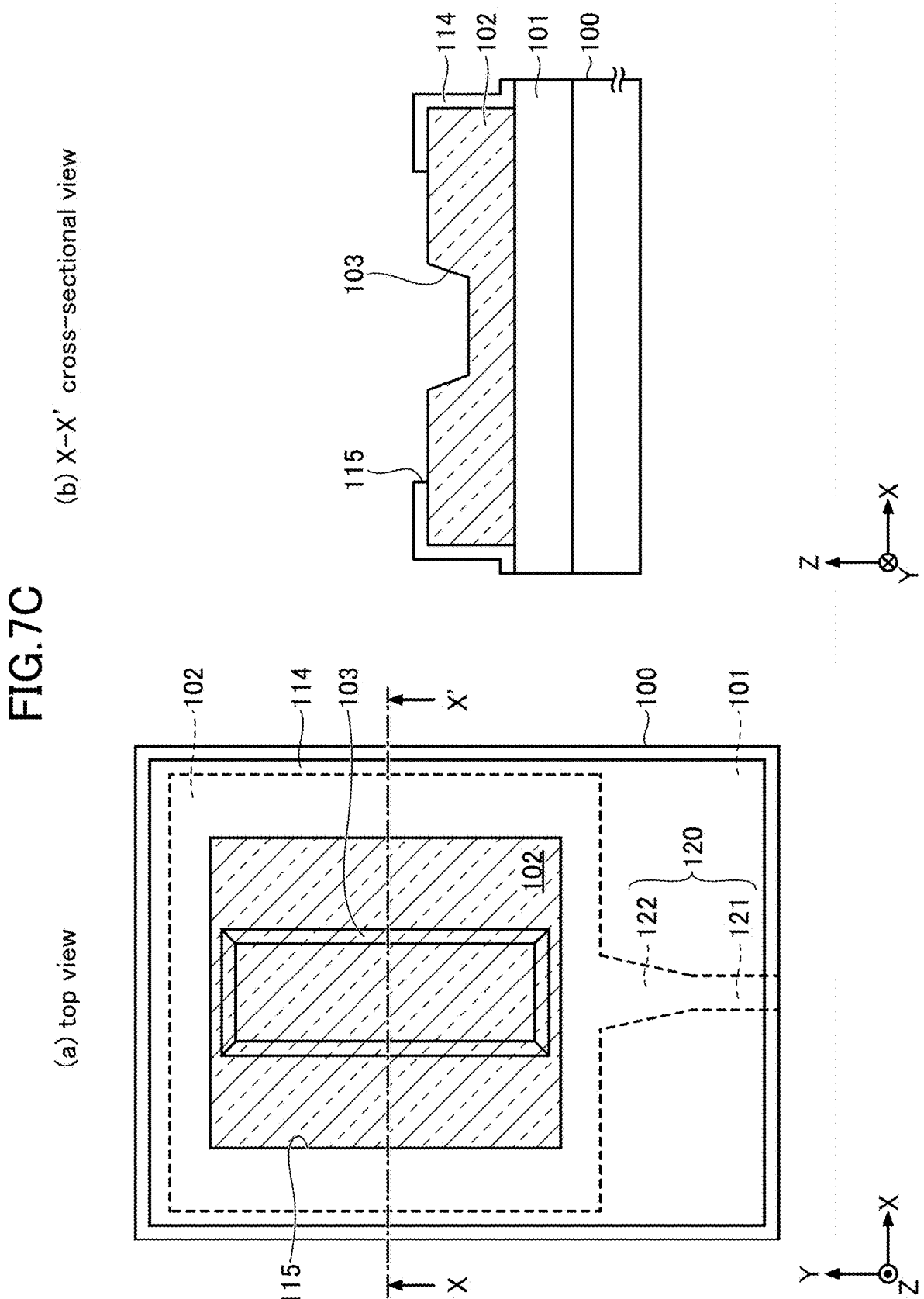
FIG. 7C illustrates a fabrication process of the photodetector of FIG. 5.

In FIG. 7C, the resist mask 124 is removed, and a SiO2 film 114 with a thickness of 20 nm is formed over the entire surface. Although the SiO2 film is transparent to the visible light, the light input layer 102 and the optical waveguide 120 covered with the SiO2 film 114 are illustrated by the broken lines in the top view (a) in order to facilitate understanding of the fabrication process. A resist mask is formed on the SiO2 film 114 by photolithography, and the SiO2 film 114 is patterned into a hard mask for Ge growth by dry etching. A part of the Si light input layer 102 is exposed in the opening 115 formed in the hard mask of the SiO2 film 114. Then, the resist mask is removed.

Figure 7D:
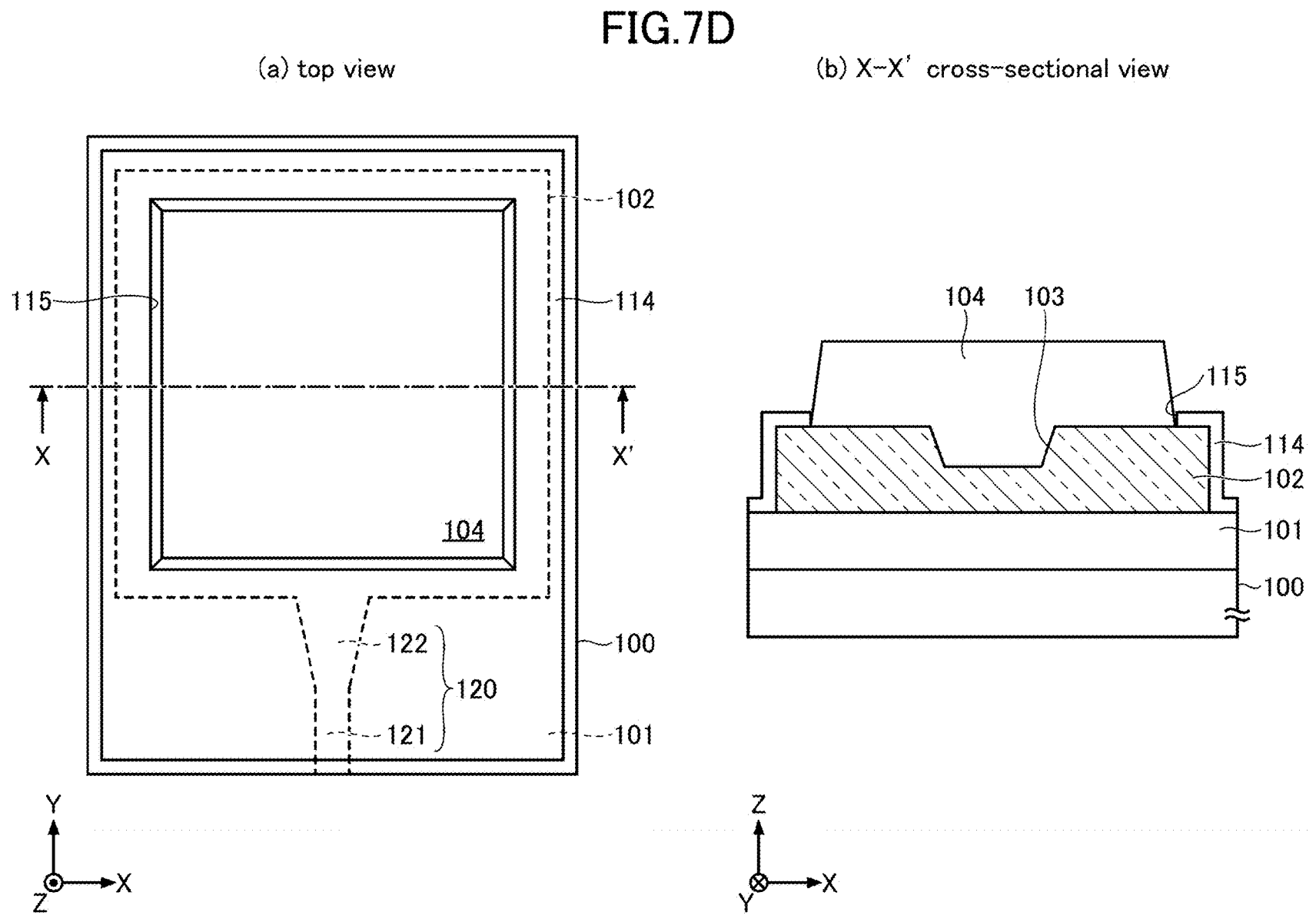

In FIG. 7D, the Ge layer is epitaxially grown in the region uncovered with the SiO2 film 114 (i.e., inside the opening 115) by a low pressure chemical vapor deposition (LP-CVD) method, whereby a Ge light absorption layer 104 is formed. The thickness of the Ge layer is 500 nm. The dimensions of the light absorption layer 104 is 30-micron length in the light propagation direction (Y direction) and 8-micron width in the width direction (X direction).

Figure 7E:
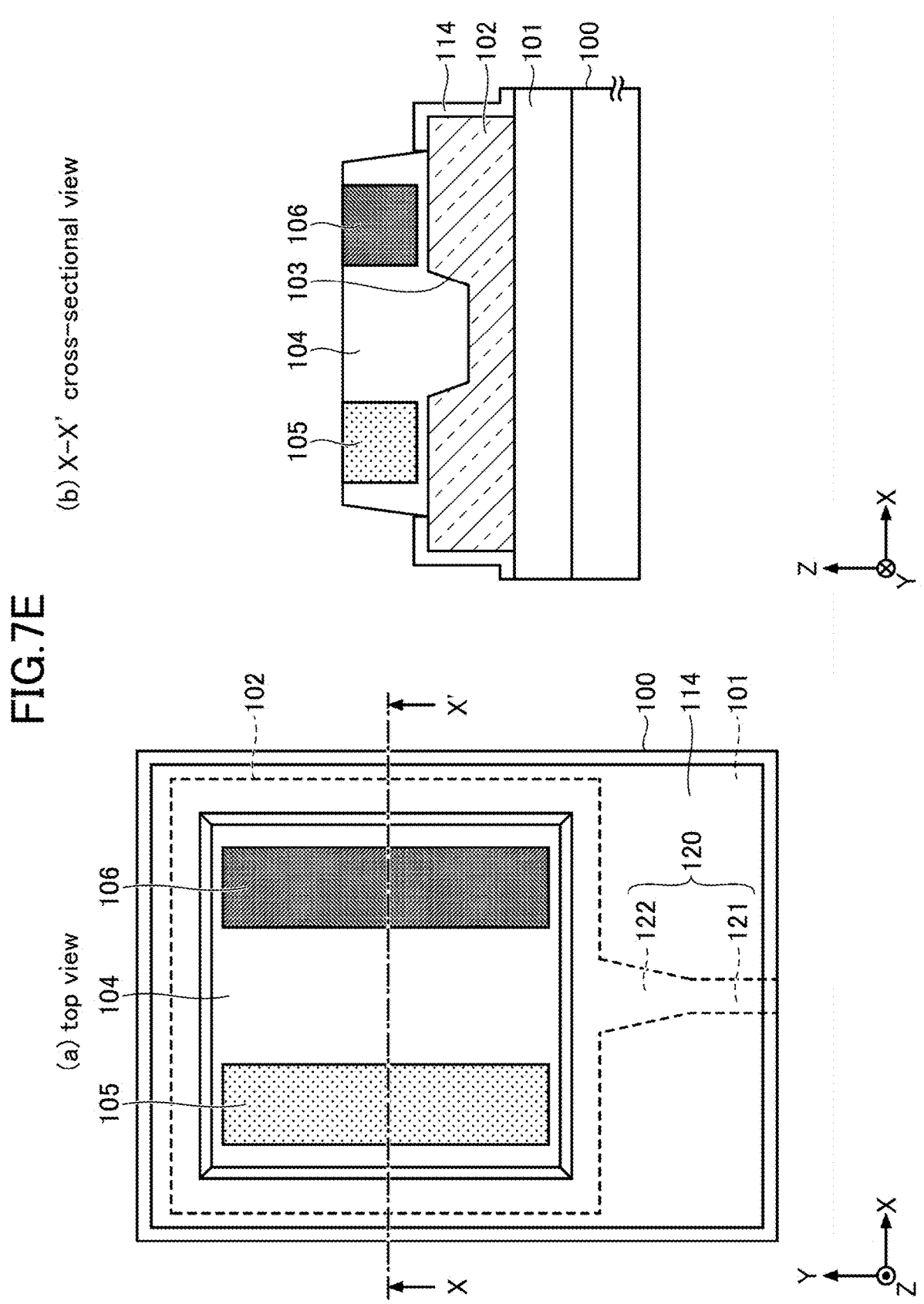
FIG. 7E illustrates a fabrication process of the photodetector of FIG. 5.

In FIG. 7E, a resist mask is formed by photolithography to expose a part of the light absorption layer 104, and boron (B) ion is implanted into the light absorption layer 104 to form an n-type electrical polarity region 105. The impurity concentration is, for example, 1 E20 [cm$^{-3}$]. Then, the resist mask is removed, and another resist mask is formed by photolithography to expose a different area the light absorption layer 104. Phosphorus (P) ion is implanted into the light absorption layer 104 to form a p-type electrical polarity region 106. Then, the resist mask is removed.

Figure 7F:
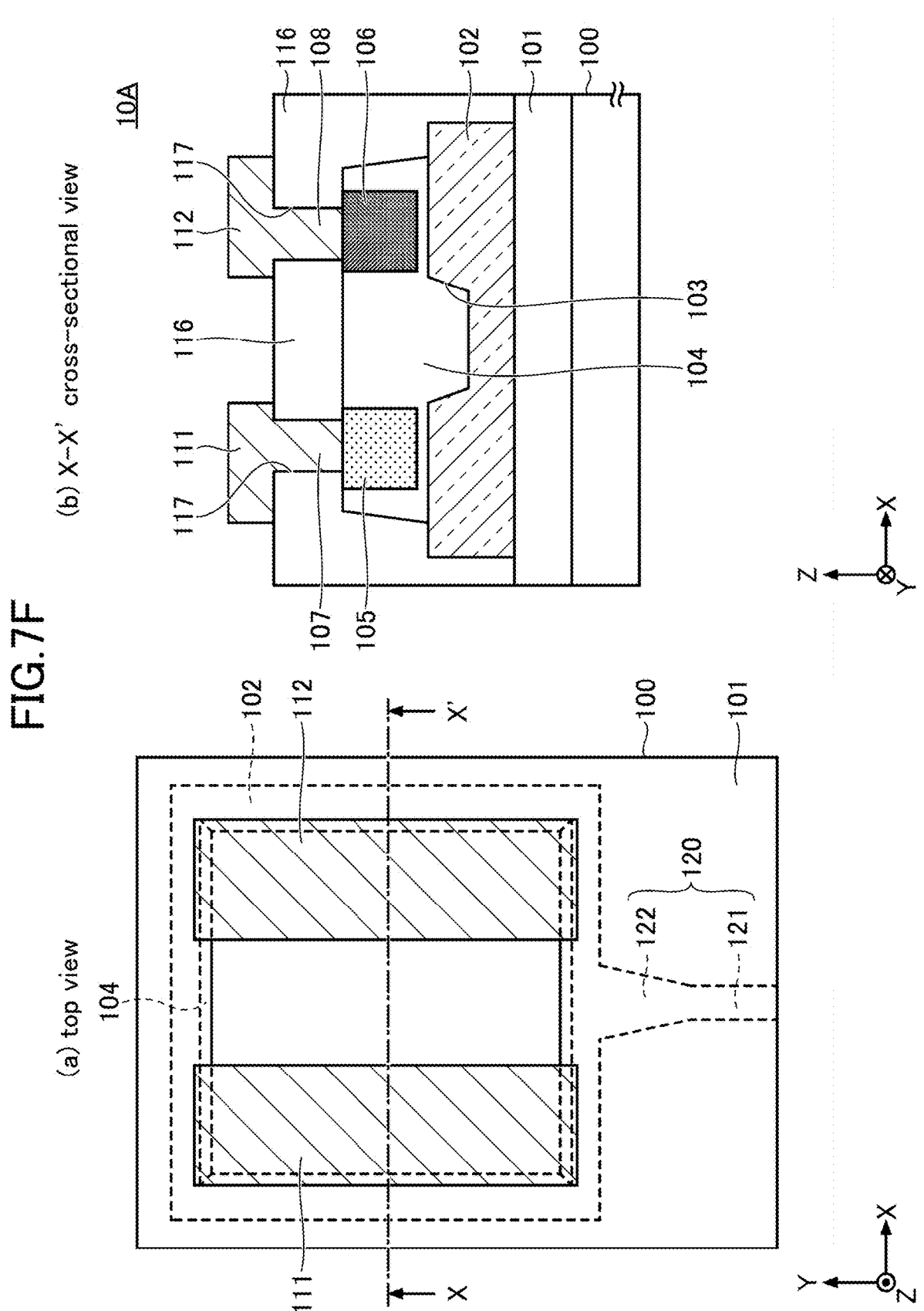
FIG. 7F illustrates a fabrication process of the photodetector of FIG. 5.

In FIG. 7F, a SiO2 film is formed as a dielectric layer 116 over the entire surface by a CVD method, up to a thickness of 1 μm, and annealing is performed to activate the injected impurities. For instance, the impurities in the Ge layer are activated by annealing at 600° C. for about 10 seconds. Then, contact holes reaching the electrical polarity regions 105 and 106 are formed in the dielectric layer 116 by photolithography and dry etching. Subsequently, an aluminum (Al) film is formed over the entire surface by sputtering. The Al film is patterned by photolithography and dry etching to form the electrodes 111 and 112 that are electrically connected to the electrical polarity regions 105 and 106, respectively. A part of the Al film embedded in the contact holes may serve as the plug electrodes 107 and 108.

The photodetector 10A in which the thickness of the light absorption layer 104 is partially increased is completed by the above-described process. The photodetector 10A can be fabricated together with other optical waveguides and/or optical devices on the SOI substrate at the same time. In this specification, the structure and the fabrication process of other optical waveguides and/or other optical devices are not illustrated.

Second Embodiment

Figure 8:
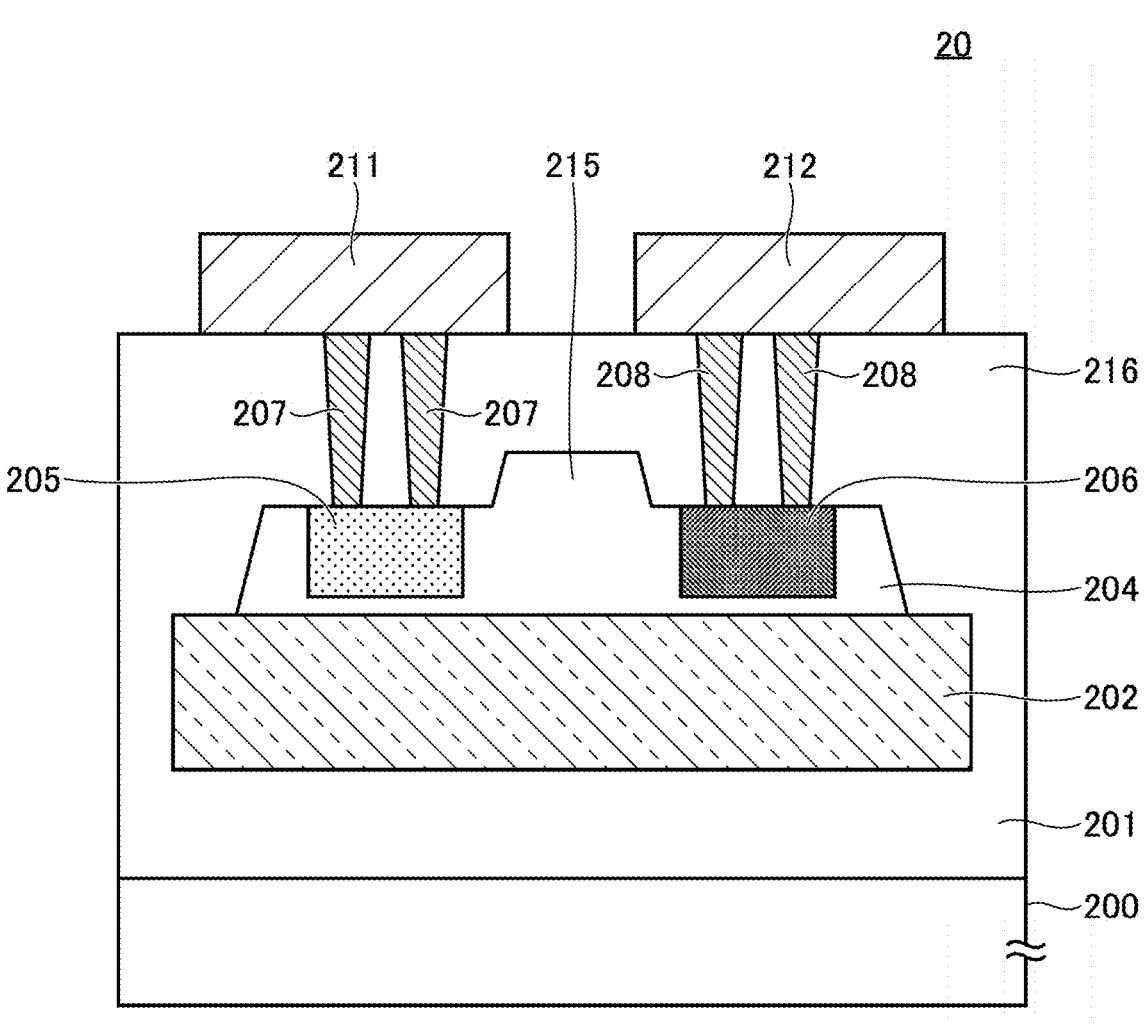
FIG. 8 is a schematic cross-sectional view of a photodetector according to the second embodiment.

FIG. 8 is a schematic cross-sectional view of a photodetector 20 according to the second embodiment. In the second embodiment, a part of the light absorption layer is thickened at the top surface of the light absorption layer, without providing a recess in the light input layer.

The photodetector 20 is formed on the dielectric layer 201 over the substrate 200. The photodetector 20 has a light absorption layer 204 and a light input layer 202 that guides a light beam into the light absorption layer 204. The entirety of the photodetector 20 is surrounded by dielectric layers 201 and 216. The light input layer 202 is formed of a first semiconductor which is transparent to the light beam having a wavelength being used, and the light absorption layer 204 is formed of a second semiconductor which absorbs the light beam of the target wavelength. For example, the first semiconductor is Si, and the second semiconductor is Ge.

The light absorption layer 204 has an electrical polarity region 205 of a first conductive type, and an electrical polarity region 206 of a second conductive type inside the layer. The electrical polarity region 205 is heavily doped with, for example, n-type impurities, and the electrical polarity region 206 is heavily doped with p-type impurities. An undoped region of the light absorption layer 204 is provided between the electrical polarity regions 205 and 206 of opposite polarities. The photodetector 20 has a homojunction PIN structure, without having a heterojunction on the electric current path.

The light absorption layer 204 has a protrusion 215 between the electrical polarity regions 205 and 206. This protrusion 215 partially increases the thickness of the light absorption layer 204, and forms a rib waveguide. The effective refractive index of the partially thickened region with the protrusion 215 is higher than the effective refractive index of the other region of the light absorption layer 204 in which the electrical polarity regions 205 and 206 are formed at both sides of the protrusion 215. The light coupled from the light input layer 202 to the light absorption layer 204 is effectively confined between the electrical polarity regions 205 and 206. Thus, spreading of light into the electrical polarity regions 205 and 206 is suppressed, and ineffective absorption is sufficiently suppressed.

A positive bias is applied to the electrical polarity region 205 via the electrode 211 and the plug electrode 207. A negative bias is applied to the electrical polarity region 206 via the electrode 212 and the plug electrode 208. The photocarriers generated in the light absorption layer 204 are subjected to a sufficiently strong electric field produced between the electrical polarity regions 205 and 206, and extracted to the associated electrodes 211 and 212.

The protrusion 215 of the light absorption layer 204 can be formed by dry etching the Ge layer epitaxially grown in FIG. 7D, without forming the recess 103 of the first embodiment. In one example, a protrusion 215 having a height of 100 nm can be formed on the top surface of the Ge layer by etching both sides of the protrusion by 100 nm, the etched regions of the Ge layer extending along the Y direction. With the configuration of the second embodiment, satisfactory optical responsivity and the response speed can be simultaneously achieved.

Third Embodiment

Figure 9:
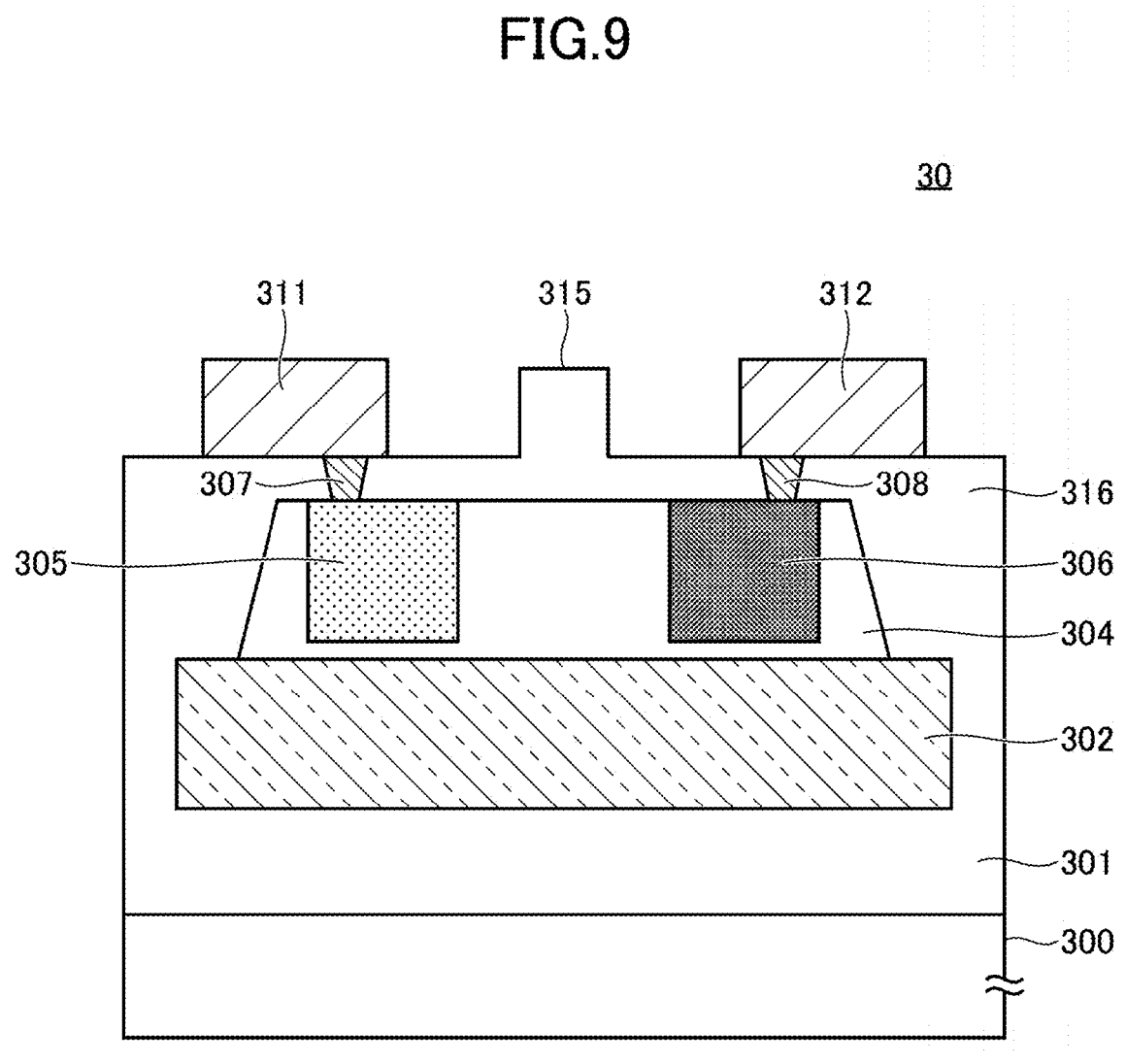

FIG. 9 is a schematic cross-sectional view of a photodetector 30 according to the third embodiment. In the third embodiment, the thickness of the dielectric layer that covers the photodetector is partially changed.

The photodetector 30 is formed on the dielectric layer 301 over the substrate 300. The photodetector 30 has a light absorption layer 304 and a light input layer 302 which guides a light beam into the light absorption layer 304. The entirety of the photodetector 30 is surrounded by dielectric layers 301 and 316. The light input layer 302 is formed of a first semiconductor which is transparent to the light beams with a wavelength being used, and the light absorption layer 304 is formed of a second semiconductor which absorbs the light beam of the target wavelength. For example, the first semiconductor is Si and the second semiconductor is Ge.

The light absorption layer 304 has an electrical polarity region 305 of a first conductive type and an electrical polarity region 306 of a second conductive type inside the layer. The electrical polarity region 305 is heavily doped with, for example, n-type impurities, and the electrical polarity region 306 is heavily doped with p-type impurities. An undoped region of the light absorption layer 304 is provided between the electrical polarity regions 305 and 306 with opposite polarities. The photodetector 30 has a homojunction PIN structure, without having a heterojunction on the electric current path.

The dielectric layer 316 covering the light absorption layer 304 has a protrusion 315 above the undoped region between the electrical polarity regions 305 and 306 of the light absorption layer 304. In this structure, a four-layer slab including a light input layer 302, a light absorption layer 304, a dielectric layer 316, and the air layer is considered. The total effective refractive index of the region with the protrusion 315, in which the dielectric layer 316 becomes thicker with respect to the air layer, is higher than the total effective refractive index of the rest of the region, in which the dielectric layer 316 is thinner with respect to the air layer. Therefore, the light coupled from the light input layer 302 to the light absorption layer 304 is confined in the region having a higher effective refractive index between the electrical polarity regions 305 and 306. Spreading of light into the electrical polarity regions 305 and 306 is suppressed and ineffective absorption is sufficiently suppressed.

A positive bias is applied to the electrical polarity region 305 via the electrode 311 and the plug electrode 307, and a negative bias is applied to the electrical polarity region 306 via the electrode 312 and the plug electrode 308. The photocarriers produced in the light absorption layer 304 are subjected to a sufficiently strong electric field between the electrical polarity regions 305 and 306, and extracted from the associated electrodes 311 and 312.

The protrusion 315 of the dielectric layer 316 is formed after the process shown in FIG. 7E, without forming the recess 103 in the process of FIG. 7B. The dielectric layer 316 is formed over the entire surface, and a part of the dielectric layer 316 is removed by dry etching to form the protrusion 315. The dielectric layer 316 may be a SiO2 layer, and unnecessary part of the SiO2 layer is dry-etched by 500 nm to form the protrusion 315 with a height of 500 nm. With the configuration of the third embodiment, satisfactory optical responsivity and response speed can be simultaneously achieved.

Fourth Embodiment

Figure 10:
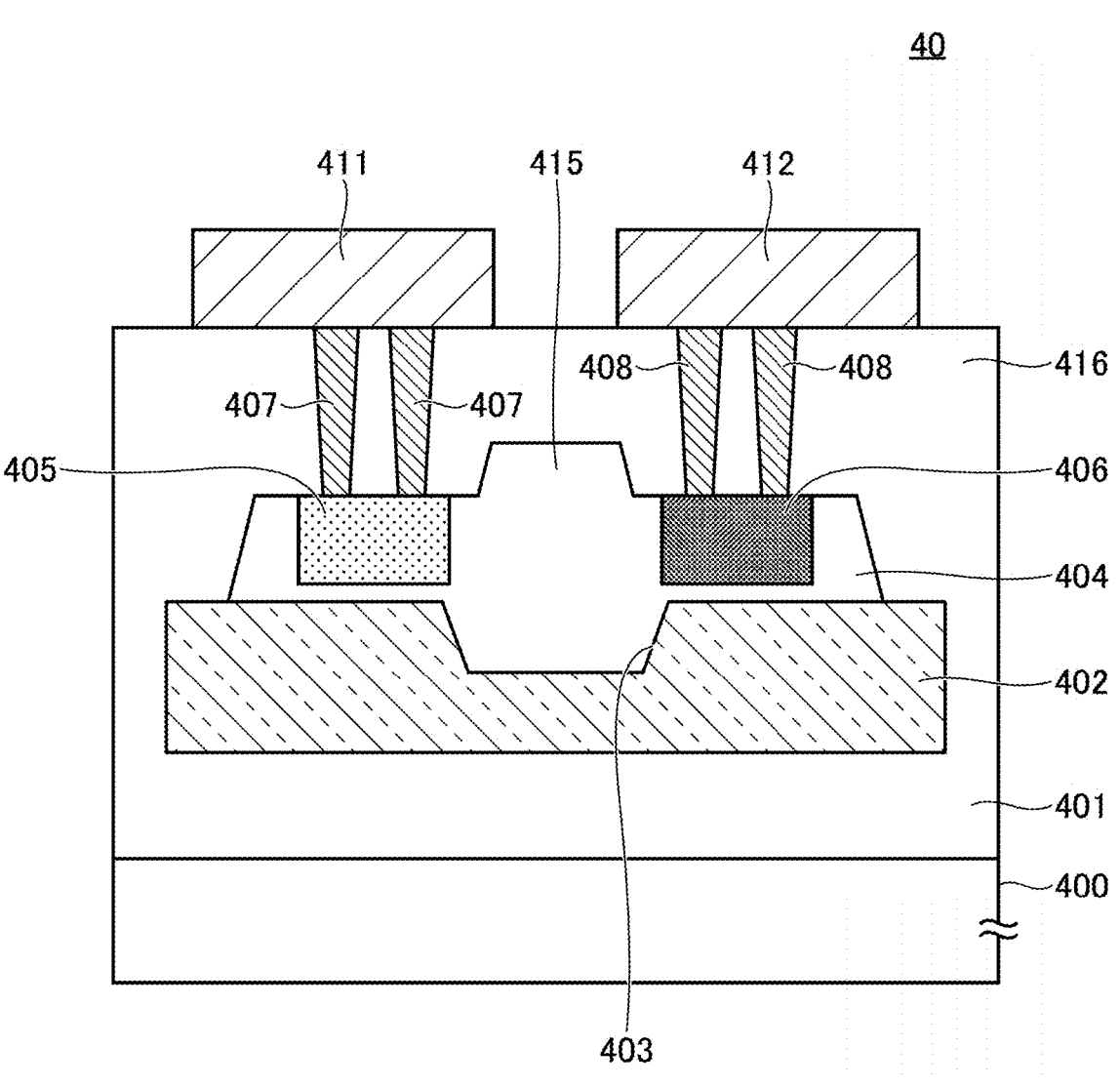
FIG. 10 is a schematic cross-sectional view of a photodetector according to the fourth embodiment.

FIG. 10 is a schematic cross-sectional view of a photodetector 40 according to the fourth embodiment. In the fourth embodiment, the thickness of the light absorption layer is partially increased with the combination of the first embodiment and the second embodiment.

The photodetector 40 is formed on the dielectric layer 401 over the substrate 400, and has a light absorption layer 404, and a light input layer 402 configured to guide a light beam to the light absorption layer 404. The entirety of the photodetector 40 is surrounded by dielectric layers 401 and 416. The light input layer 402 is formed of a first semiconductor which is transparent to the light beam with a wavelength being used, and the light absorption layer 404 is formed of a second semiconductor which absorbs the light beam being used. For example, the first semiconductor is Si and the second semiconductor is Ge.

The light absorption layer 404 has an electrical polarity region 405 of a first conductive type, and an electrical polarity region 406 of a second conductive type inside the layer. The electrical polarity region 405 is heavily doped with, for example, n-type impurities, and the electrical polarity region 406 is heavily doped with p-type impurities. An undoped region of the light absorption layer 404 is provided between the electrical polarity regions 405 and 406 having opposite polarities. The photodetector 40 has a homojunction PIN structure, without having a heterojunction on the electric current path.

The light input layer 402 has a recess 403, and the light absorption layer 404 has a protrusion 415 in the area between the electrical polarity regions 405 and 406. The thickness of the light absorption layer 404 is increased at the undoped region between the electrical polarity regions 405 and 406, and the effective refractive index of this region is greater than the effective refractive index of the rest of the light absorption layer (more specifically, both sides of the recess 403 or the protrusion 415). The light coupled from the light input layer 402 to the light absorption layer 404 is confined in the undoped region which is located between the electrical polarity regions 405 and 406 and has a higher effective refractive index. Spreading of light into the electrical polarity regions 405 and 406 is suppressed, and ineffective absorption is sufficiently suppressed.

A positive bias is applied to the electrical polarity region 405 via the electrode 411 and the plug electrode 407, and a negative bias is applied to the electrical polarity region 406 via the electrode 412 and the plug electrode 408. The photocarriers produced in the light absorption layer 404 are subjected to a sufficiently strong electric field between the electrical polarity regions 405 and 406, and are extracted from the associated electrodes 411 and 412. With the configuration of the fourth embodiment, satisfactory optical responsivity and response speed can be both achieved.

Figure 11:
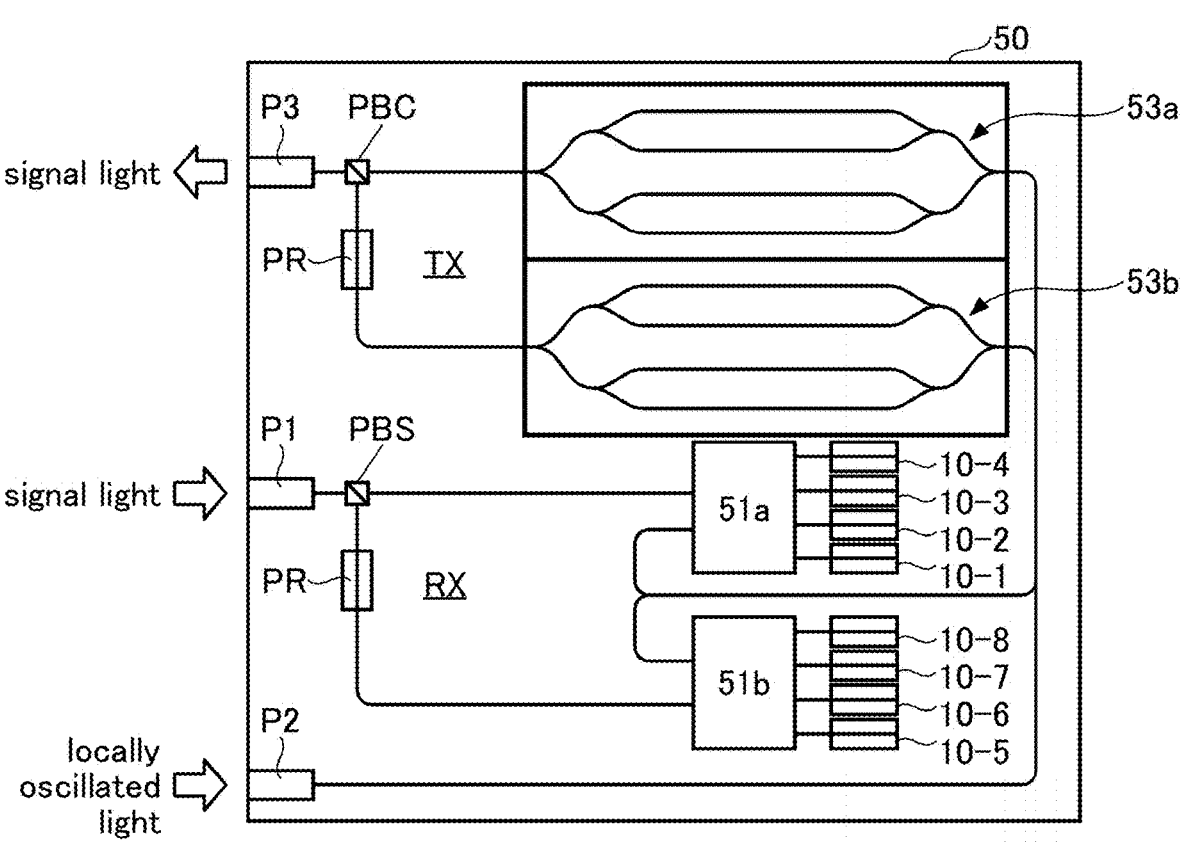
FIG. 11 is a schematic plan view of a photonic integrated device for a transceiver using the photodetector of an embodiment.

FIG. 11 is a schematic diagram of a photonic integrated device 50 for transceivers, using photodetectors according to an embodiment. The photonic integrated device 50 includes an optical transmitter TX and an optical receiver RX. The photonic integrated device 50 is used in an optical coherent transceiver. Locally oscillated light is incident onto the port P2, and supplied to the optical transmitter TX and the optical receiver RX.

In the optical receiver RX, the signal light incident onto the port P1 is split into two orthogonal polarization waves by the polarization beam splitter PBS. One polarization is incident onto the 90° hybrid optical mixer 51*a*. The other polarization is incident onto the 90° hybrid optical mixer 51*b* after converting the polarization into the same polarization of another optical path by the polarization rotator PR.

The 90° hybrid optical mixer 51*a* detects the incident signal light (polarization wave) by the locally oscillated light, and outputs four light beams which have a 90-degree phase difference with respect to each other. The four light beams are detected by photodetectors 10-1 to 10-4. The 90° hybrid optical mixer 51*b* detects the incident signal light (polarization wave) by locally oscillated light, and outputs four light beams which have a 90-degree phase difference with respect to each other. The four light beams are detected by photodetectors 10-5 to 10-8.

The photodetector pair 10-1 and 10-2 and the photodetector pair 10-3 and 10-4 may form balanced photodiodes, respectively. In this case, the difference between the outputs of the photodetectors 10-1 and 10-2 is extracted as an in-phase (I) component of the first polarization, and the difference between the outputs of the photodetectors 10-3 and 10-4 is extracted as a quadrature-phase (Q) component of the first polarization.

Likewise, the photodetector pair 10-5 and 10-6 and the photodetector pair 10-7 and 10-8 may form balanced photodiodes, respectively. The difference between the outputs of the photodetectors 10-5 and 10-6 is extracted as an in-phase (I) component of the second polarization, and the difference between the outputs of the photodetectors 10-7 and 10-8 is extracted as a quadrature-phase (Q) component of the second polarization.

The polarization beam splitter PBS, the polarization rotator PR, 90° hybrid optical mixers 51*a* and 51*b* are included in an optical circuit connected to the photodetectors 10-1 to 10-8. In each of the photodetectors 10-1 to 10-8, ineffective absorption is suppressed, and the efficiency of application of electric field is improved. The photodetectors 10-1 to 10-8 are capable of high-speed operation, while maintaining satisfactory optical responsivity. The photocurrents output from the photodetectors 10-1 to 10-8 are amplified and converted into voltage signals by an electric circuit which includes transimpedance amplifiers, and input to a digital signal processor (DSP) of the subsequent stage.

The optical transmitter TX has optical modulators 53*a* and 53*b*. The optical modulators 53*a* and 53*b* are Mach-Zehnder (MZ) type IQ modulators in this example. The locally oscillated light beam used as a carrier wave is modulated by data signals input from the DSP to each of the optical modulators 53*a* and 53*b*. The light beam output from the optical modulator 53*b* is rotated by 90 degrees by the polarization rotator PR, and then combined with the light beam output from the optical modulator 53*a* at the polarization beam combiner PBC. The combined light beam is output from the port P3 as optical signal light of a dual polarization modulation scheme.

The photonic integrated device 50 is not limited to the application to dual polarization modulation type transceivers, and it may be used for optical transceivers of other modulation schemes such as quadrature phase shift keying (QPSK) or multi-level quadrature amplitude modulation (QAM). The plurality of photodetectors 10 may be arranged in a one-dimensional array, or a two-dimensional array. In either case, high-speed, high-sensitivity photodetection can be achieved owing to the satisfactory optical responsivity and operating speed of each of the photodetectors.

It is needless to say that the same effect can be achieved using any of the photodetectors 20, 30, and 40, in place of the photodetector 10. A SiGe photodetector or a GeSn photodetector may be used, in place of the Ge photodetector. Such Ge-compound photodetectors can suppress ineffective absorption because of the above-described light confining structure, and the electric field can be applied at a sufficient level to extract the photocarriers produced in the Ge-compound photodetector.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present inventions have been described in detail, it should be understood that the various changes, substitutions, and alterations could be made hereto without departing from the scope of the invention.

What is claimed is:

1. A photodetector comprising:
 a substrate;
 a light input layer formed as a first semiconductor material over the substrate, the first semiconductor material being transparent to a wavelength being used; and
 a light absorption layer formed as a second semiconductor material on the light input layer, the second semiconductor material having a bandgap smaller than that of the first semiconductor material,
 wherein the light absorption layer has
  a first region doped with a first conductivity-type impurity,
  a second region doped with a second conductive-type impurity different from the first conductivity-type impurity, and
  an undoped region between the first region and the second region, the first region, the undoped region and the second region being arranged in a direction parallel to the substrate, and
 wherein
  the light absorption layer has a region having an effective refractive index higher than rest of the light absorption layer between the first region and the second region,
  the light absorption layer has a thick portion where a thickness of the light absorption layer is increased between the first region and the second region, and
  the thick portion has a width that is less than a width of the undoped region.

2. The photodetector as claimed in claim 1, wherein the thickness of the light absorption layer is partially increased between the first region and the second region, such that the light absorption layer has a region whose thickness is greater than the rest of the light absorption layer between the first region and the second region.

3. The photodetector claimed in claim 2, wherein the light input layer has a recess at a position corresponding to the region whose thickness is greater than the rest of the light absorption layer.

4. The photodetector as claimed in claim 2, wherein the light absorption layer has a protrusion at a position corresponding to the region whose thickness is greater than the rest of the light absorption layer.

5. The photodetector as claimed in claim 2, wherein a change in the thickness of the light absorption layer at the region whose thickness is greater than the rest of the light absorption layer is $\frac{1}{10}$ or more of the wavelength being used.

6. The photodetector as claimed in claim 1, further comprising:
a dielectric layer covering the light absorption layer,
wherein a thickness of the dielectric layer is partially increased in a region that covers an area between the first region and the second region of the light absorption layer.

7. The photodetector as claimed in claim 1, wherein a depth of the first region and the second region reaches $\frac{1}{2}$ or more of an average thickness of the light absorption layer from a top surface of the light absorption layer.

8. The photodetector as claimed in claim 1, wherein the first semiconductor material is Si, and the second semiconductor material is at least one material from among Ge, SiGe, or GeSn.

9. The photodetector as claimed in claim 1, further comprising:
a first electrode electrically connected to the first region; and a second electrode electrically connected to the second region,
such that the first electrode and the second electrode are configured to apply reverse biases to the first region and the second region.

10. A photonic integrated device comprising:
a photodetector; and
an optical circuit optically connected to the photodetector,
wherein the photodetector includes
a substrate,
a light input layer formed as a first semiconductor material over the substrate, the first semiconductor material being transparent to a wavelength being used, and
a light absorption layer formed as a second semiconductor material on the light input layer, the second semiconductor material having a bandgap smaller than that of the first semiconductor material,
wherein the light absorption layer has
a first region doped with a first conductivity-type impurity,
a second region doped with a second conductive-type impurity different from the first conductivity-type impurity, and
an undoped region between the first region and the second region, the first region, the undoped region and the second region being arranged in a direction parallel to the substrate, and
wherein
the light absorption layer has a region having an effective refractive index higher than rest of the light absorption layer between the first region and the second region,
the light absorption layer has a thick portion where a thickness of the light absorption layer is increased between the first region and the second region, and
the thick portion has a width that is less than a width of the undoped region.

* * * * *